US005341035A

United States Patent [19]

Shibayama et al.

[11] Patent Number: 5,341,035

[45] Date of Patent: Aug. 23, 1994

[54] SUBSTRATE POTENTIAL GENERATOR

[75] Inventors: Akinori Shibayama, Neyagawa; Toshio Yamada, Kadoma, both of Japan

[73] Assignee: Matsushita Electric Industrial Co., Ltd., Osaka, Japan

[21] Appl. No.: 709,961

[22] Filed: Jun. 4, 1991

[30] Foreign Application Priority Data

Jun. 4, 1990 [JP] Japan .................................. 2-146542
Nov. 19, 1990 [JP] Japan .................................. 2-313557
May 23, 1991 [JP] Japan .................................. 3-118253

[51] Int. Cl.[5] .......................... H03L 1/00; H03L 5/00

[52] U.S. Cl. .............................. 307/296.2; 307/296.8; 307/350

[58] Field of Search ............... 307/296.2, 296.6, 296.8, 307/350, 359, 362

[56] References Cited

U.S. PATENT DOCUMENTS 4,670,668 6/1987 Liu .................................. 307/296.2
4,775,959 10/1988 Sato et al. ........................... 365/189
4,794,278 12/1988 Vajdic .............................. 307/296.2
4,862,415 8/1989 Nakano ............................ 307/296.1
4,905,199 2/1990 Miyamoto ........................ 307/296.2
4,961,007 10/1990 Kumanoya et al. ............. 307/296.2
4,961,167 10/1990 Kumanoya et al. ............. 307/296.2
5,003,197 3/1991 Nojima et al. ................... 307/296.2
5,057,704 10/1991 Koyanagi et al. ............... 307/296.2

*Primary Examiner*—John Zazworsky
*Attorney, Agent, or Firm*—Wenderoth, Lind & Ponack

[57] ABSTRACT

In a substrate potential generator, a substrate potential is supplied by a substrate potential supplier controlled by a substrate potential detector. The substrate potential detector sends a setting signal having a hysteresis characteristic relative to the substrate potential. That is, the setting signal is higher when the substrate potential supplier is stopped than when the substrate potential supplier is activated or when negative charges are injected into the substrate potential. Thus, the operation of the substrate potential supplier is stopped after the substrate potential becomes lower than the lower setting potential when the substrate potential supplier is activated, while the operation of the substrate potential supplier is started after the substrate potential becomes higher than the upper setting potential after the operation of the substrate potential supplier is stopped. Therefore, the starting and stopping of the substrate potential supplier is not repeated so frequently, so that the dissipating charge and discharge currents accompanied with the starting and stopping will not be enhanced wastefully.

9 Claims, 9 Drawing Sheets

SUBSTRATE POTENTIAL GENERATOR

BACKGROUND OF THE INVENTION

The present invention relates to a substrate potential generator for a semiconductor integrated circuit.

A substrate potential generator is used as a voltage supply to generate a prescribed electric voltage of a polarity opposite to that of an externally supplied power source voltage and to apply the prescribed electric voltage to a substrate of a semiconductor integrated circuit. Previously, as shown in FIG. 1, such a substrate potential generator is composed of a substrate potential detector 1 receiving a power supply potential $V_{REF}$ and a substrate potential $V_{BB}'$ and a substrate potential supplier 2 for supplying the substrate potential to be controlled according to a substrate potential detection signal $V_D'$ as an output from the substrate potential detector 1.

The operation of such a substrate potential generator is explained below. FIG. 2 shows a circuit diagram of an example of a substrate potential detector 1, wherein a P-type MOS transistor $Q_{p21}$, an N-type MOS transistor $Q_{n21}$ and an N-type MOS transistor $Q_{n22}$ shorted between the gate and the drain thereof are connected in series. The gates of the transistors $Q_{p21}$ and $Q_{n21}$ are connected to the ground potential $V_{SS}$. The source potential of the MOS transistor $Q_{p21}$ is designated as supply potential $V_{REF}$, while that of the MOS transistor $Q_{n22}$ is equal to the substrate potential $V_{BB}'$ received from the substrate potential supplier 2.

The source potential and the gate potential of the transistor $Q_{p21}$ are equal to the supply potential $V_{REF}$ and the ground potential $V_{BB}'$, respectively. The voltage between the gate and the source potentials is lower than the threshold voltage of the transistor $Q_{p21}$, that is, the gate-to-source voltage is lower than the threshold voltage of the transistor $Q_{p21}$, so that a drain current flows through the transistor $Q_{p21}$. If the substrate potential $V_{BB}'$ becomes lower than a set voltage which is lower than the ground potential $V_{SS}$, the transistor $Q_{n22}$ is turned on. Then, the potential at a connection point 26, that is, the source potential of the transistor $Q_{n21}$ becomes lower than the threshold voltage of the transistor $Q_{n21}$, so that the transistor $Q_{n21}$ is also turned on. Therefore, because all the transistors $Q_{p21}$, $Q_{n21}$ and $Q_{n22}$ are in the on-states, the drain potentials of the transistors $Q_{p21}$ and $Q_{n21}$ or the substrate potential detection signal $V_D'$ becomes low enough to stop the operation of the substrate potential supplier 2.

On the contrary, if the substrate potential $V_{BB}'$ floats up to a potential above the set value, the potential difference to lower the drain potential with the transistor $Q_{n22}$ becomes small, so that the gate-to-source voltage of the transistor $Q_{n21}$ is kept at a voltage lower or a little higher than its threshold voltage. Thus, the transistor $Q_{n21}$ is turned off or only a small current can flow therethrough. Then, the substrate potential detection signal $V_D'$ or the drain potentials of the transistors $Q_{p21}$ and $Q_{n21}$ increases until the drain current of the transistor $Q_{n21}$ becomes equal to that of the transistor $Q_{p21}$. Therefore, the substrate potential detection signal $V_D'$ becomes a little lower than the source potential and high enough to activate the substrate potential supplier 2.

As explained above, the substrate potential detector 1 sends a low level substrate potential detection signal $V_D'$ to the substrate potential in order to stop the action of the substrate potential supplier 2 if the actual substrate potential $V_{BB}'$ is lower than the set potential on the basis of the supply potential and the substrate potential $V_{BB}$, otherwise it sends a high-level substrate potential detection signal in order to activate the substrate potential supplier 2.

Further, the substrate potential supplier 2 is controlled according to the substrate potential detection signal $V_D'$. If the substrate potential detection signal $V_D'$ is a high-level, negative charges are supplied to the substrate until the substrate potential $V_{BB}'$ becomes lower by the supply potential $V_{REF}$ than the threshold voltage of the transistor for supplying charges to the substrate. On the other hand, if the substrate potential detection signal $V_D'$ is a low-level, the operation of the substrate potential supplier 2 is stopped so as not to supply negative charges to the substrate.

As explained above, the previous substrate potential generator can generate a high-level substrate potential detection signal $V_D'$ according to the power supply potential $V_{REF}$ and the substrate potential $V_{BB}'$ in the substrate potential detector 1 if the substrate potential $V_{BB}'$ is higher than the set potential, so as to operate the substrate potential supplier 2 in order to lower the substrate potential $V_{BB}'$ as long as the high level substrate potential detection signal $V_D'$ is outputted. On the other hand, if the substrate potential $V_{BB}'$ becomes lower below the set potential $V_{set}$, the substrate potential detector 1 sends a low-level substrate potential detection signal $V_D'$ to stop the operation of the substrate potential supplier 2 to make the substrate potential $V_{BB}'$ equal to the set potential $V_{set}$. If the substrate potential $V_{BB}'$ becomes higher than the set potential $V_{set}$ again, the substrate potential detector 1 sends a high level substrate potential detection signal $V_D'$ to activate the substrate potential supplier 2 in order to lower the substrate potential $V_{BB}'$ again. These processes are repeated to make the substrate potential $V_{BB}'$ the set potential $V_{set}$.

However, in the previous substrate potential generator, the substrate potential detection signal $V_D'$ for controlling the operation of the substrate potential supplier 2 is determined according to the set potential $V_{set}$ to be set at a point with respect to the substrate potential $V_{BB}'$. Then, if the substrate potential $V_{BB}'$ is around the set potential $V_{set}$, the operation of the substrate potential supplier 2 is stopped if the substrate potential $V_{BB}'$ becomes higher than the set potential $V_{set}$, otherwise the operation is started again. Therefore, the number of stop and start repetition is high because the substrate potential supplier 2 is activated or stopped above or below the set potential $V_{set}$ at a point with respect to the substrate potential. Charge and discharge currents of the capacitances of signal lines and transistors are accompanied by the changes between the start and stop. Thus, a problem arises in that the current is enhanced even if the dissipation current of the substrate potential supplier 2 is decreased.

SUMMARY OF THE INVENTION

It is an object of the present invention to provide a substrate potential generator which can prevent the enhancement of dissipation current without performing unnecessary start and stop repetitions of the substrate potential supplier.

A first substrate potential generator according to the present invention comprises: (a) a substrate potential detector for generating a first substrate potential detection signal according to a reference potential and a received substrate potential until the substrate potential decreases to a prescribed lower setting potential, and for generating a second substrate potential detection signal until the substrate potential increases to a prescribed upper setting potential which is higher than the lower setting potential; and (b) a substrate potential supplier for supplying the substrate potential to a substrate according to the substrate potential detection signals received from the substrate potential detector, in which the substrate potential supplier is deactivated so as to increase the substrate potential after the second substrate potential detection signal is received, and is activated so as to decrease the substrate potential after the first substrate potential detection signal is received.

The first substrate potential detector does not determine the substrate potential detection signal according to a setting potential to be set at a point with respect to the substrate potential $V_{BB}$. On the contrary, the substrate potential generator has a hysteresis characteristic on the substrate potential $V_{BB}$. That is, the setting potential of the substrate potential $V_{BB}$ is made higher when the substrate potential supplier is stopped than when the substrate potential supplier is activated or when negative charges are injected into the substrate potential $V_{BB}$. Thus, the operation of the substrate potential supplier is stopped after the substrate potential is made lower than the lower setting potential when the substrate potential supplier is activated while the operation of the substrate potential supplier is started after the substrate potential becomes higher than the upper setting potential when the operation of the substrate potential supplier is stopped. Therefore, the start and stop of the substrate potential supplier is not repeated so frequently that the dissipating charge and discharge currents accompanied with the start and stop will not be enhanced wastefully.

A second substrate potential generator according to the present invention comprises: (a) a first substrate potential detector for generating a first substrate potential detection signal according to a reference potential and a received substrate potential until the substrate potential decreases to a prescribed lower setting potential, and for generating a second substrate potential detection signal until the substrate potential increases to a prescribed upper setting potential; (b) a first substrate potential supplier for supplying the substrate potential according to the substrate potential detection signals received from the substrate potential detector, in which the first substrate potential supplier is deactivated so as to increase the substrate potential after the second substrate potential detection signal is received from the first substrate potential detector, and is activated so as to decrease the substrate potential after the first substrate potential detection signal is received from the first substrate potential detector; (c) a control signal generator for supplying a control signal to the second substrate potential detector when the substrate potential has to be increased quickly; (d) a second substrate potential detector, which is activated by the control signal received from the control signal generator and which can respond faster than the first substrate potential detector, for generating a first substrate potential detection signal according to a reference potential and a received substrate potential until the substrate potential decreases to a prescribed lower setting potential, and for generating a second substrate potential detection signal until the substrate potential increases to a prescribed upper setting potential; and (e) a second substrate potential supplier for supplying the substrate potential according to the substrate potential detection signals received from the second substrate potential detector, in which the second substrate potential supplier is deactivated so as to increase the substrate potential after the second substrate potential detection signal is received from the second substrate potential detector, and is activated so as to decrease the substrate potential after the first substrate potential detection signal is received from the second substrate potential detector.

It is an advantage of the present invention that a substrate potential generator of lower dissipation current can be provided.

BRIEF DESCRIPTION OF THE DRAWINGS

Further objects and advantages of the present invention will be apparent from the detailed explanation of the embodiments with reference to the accompanied drawings, in which.

DETAILED DESCRIPTION OF THE PREFERRED EMBODIMENT

Embodiments of the present invention will be described below with reference to the drawings.

Figure 1:
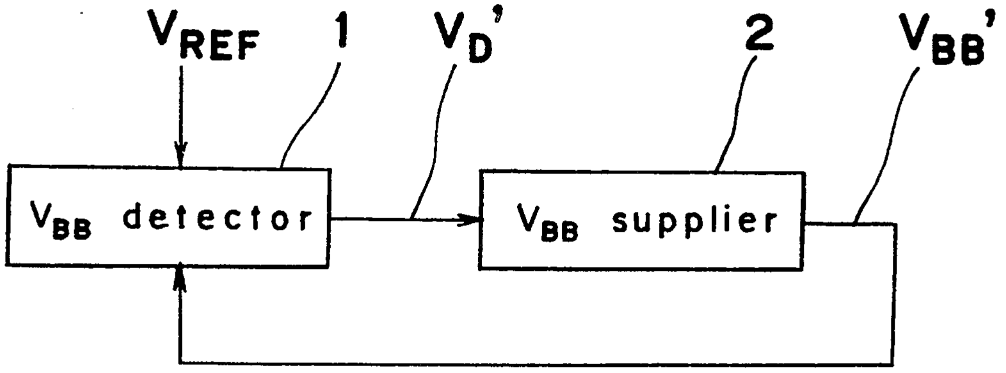
Fig. 1 PRIOR ART
FIG. 1 is a block diagram of a prior art substrate potential generator.
Figure 2:
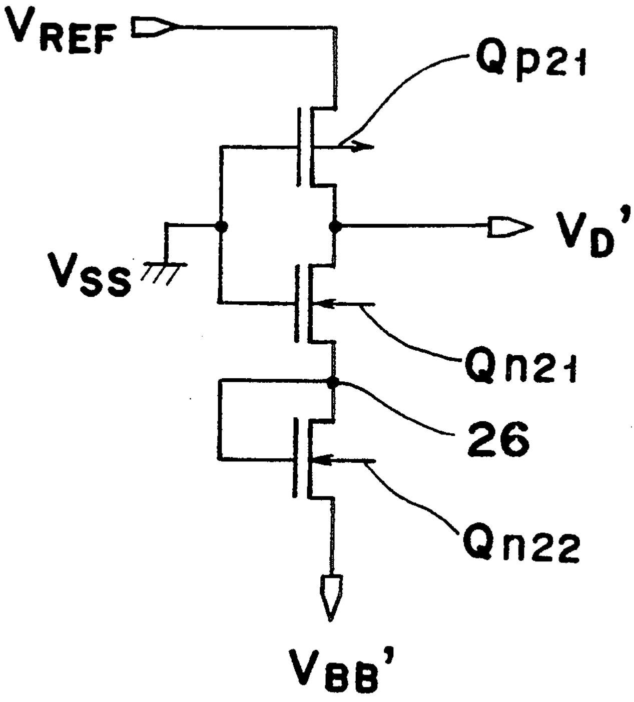
Fig. 2 PRIOR ART
FIG. 2 is a circuit diagram of a substrate potential detector of the substrate potential generator shown in FIG. 1.
Figure 3:
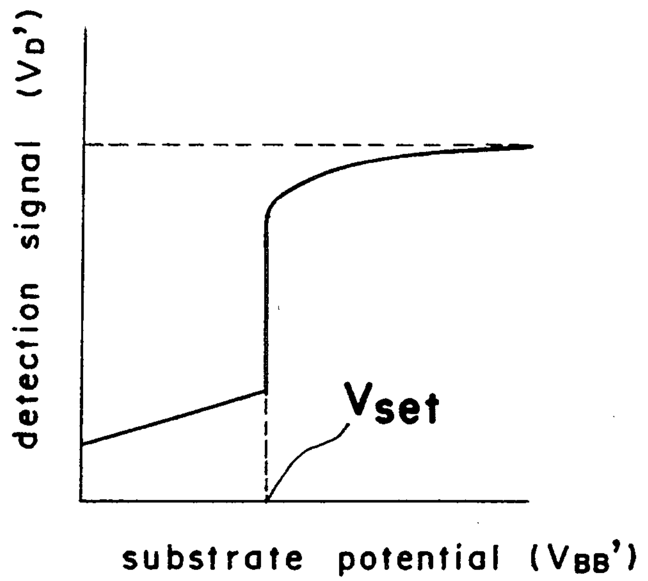
Fig. 3 PRIOR ART
FIG. 3 is a diagram of the substrate potential of the substrate potential supplier shown in FIG. 2.
Figure 4:
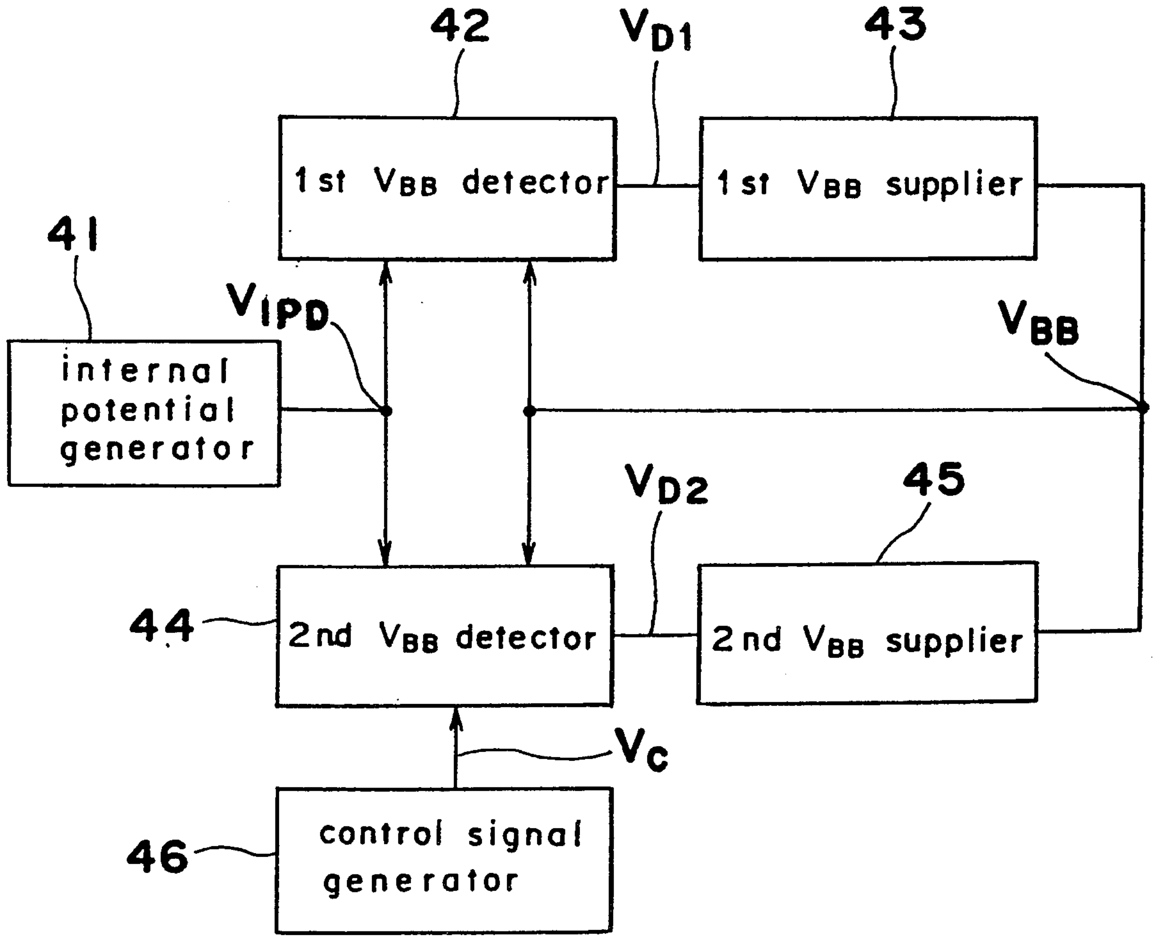
FIG. 4 is a block diagram of a substrate potential generator.

FIG. 4 shows a block diagram of an embodiment of a substrate potential generator, which includes an internal potential generator 41, a first substrate potential detector 42 which is always activated after the electric power supply is turned on, a first substrate potential supplier 43 controlled by the first substrate potential detector 42, a second substrate potential detector 44 controlled according to a control signal $V_C$, a second substrate potential supplier 45 controlled by the second substrate potential detector 44, and a control signal generator 46 for supplying the control signal $V_C$ to control the second substrate potential detector 44. Both substrate potential detectors 42 and 44 receive the substrate potential $V_{BB}$ generated by the substrate potential suppliers 43, 45, and a first power supply potential $V_{IPD}$ which is the internal supply potential generated by the internal potential generator 41. Further, the supply of negative charges to the substrate by both substrate potential suppliers 43 and 45 for supplying or not supplying negative charges to the substrate are controlled according to substrate potential detection signals $V_{D1}$ and $V_{D2}$ which are the output signals of the substrate potential detectors 42 and 44, respectively.

In general, when a semiconductor chip is activated, there are periods when a large quantity of negative charges must be supplied and periods when such negative charges need not be supplied. In order to enhance the amount of negative charges to be supplied to the substrate, the supply current performance of the substrate potential generator has to be increased, so that the dissipation current of the substrate will increase according to the enhancement of the performance. In order to solve this problem, two kinds of substrate potential suppliers 43 and 45 are provided in this embodiment. That is, the second substrate potential supplier 45 can supply a larger amount of negative charges though the dissipation current is larger, and it is used when the supply of more negative charges is required, for example when the substrate potential $V_{BB}$ has to be lowered in a short period such as after the power supply is turned on or when a large substrate current is generated in a peripheral or the like. The first substrate potential supplier 43 can supply a smaller amount of negative charges though the dissipating current is smaller, and only the first substrate potential supplier 43 is used when the dissipation current has to be decreased for example in the case of standby.

Further, it is also a problem that the dissipation current is always dissipated in a substrate potential detector. In order to solve this problem, two kinds of substrate potential detectors 42 and 44 are provided in this embodiment. Then, when the second substrate potential supplier 45 dissipating a larger amount of current is activated, the second substrate potential detector 44 is used which can respond fast though the dissipation current is larger. On the other hand, when the first substrate potential supplier 43 using a smaller current is activated, the first substrate potential detector 42 which dissipates a smaller current is activated though it responds slowly. Then, the dissipation current of the substrate potential generator can be made smaller while the performance is not degraded.

The operation of the substrate potential generator will be explained below for each block in FIG. 4.

Figure 5:
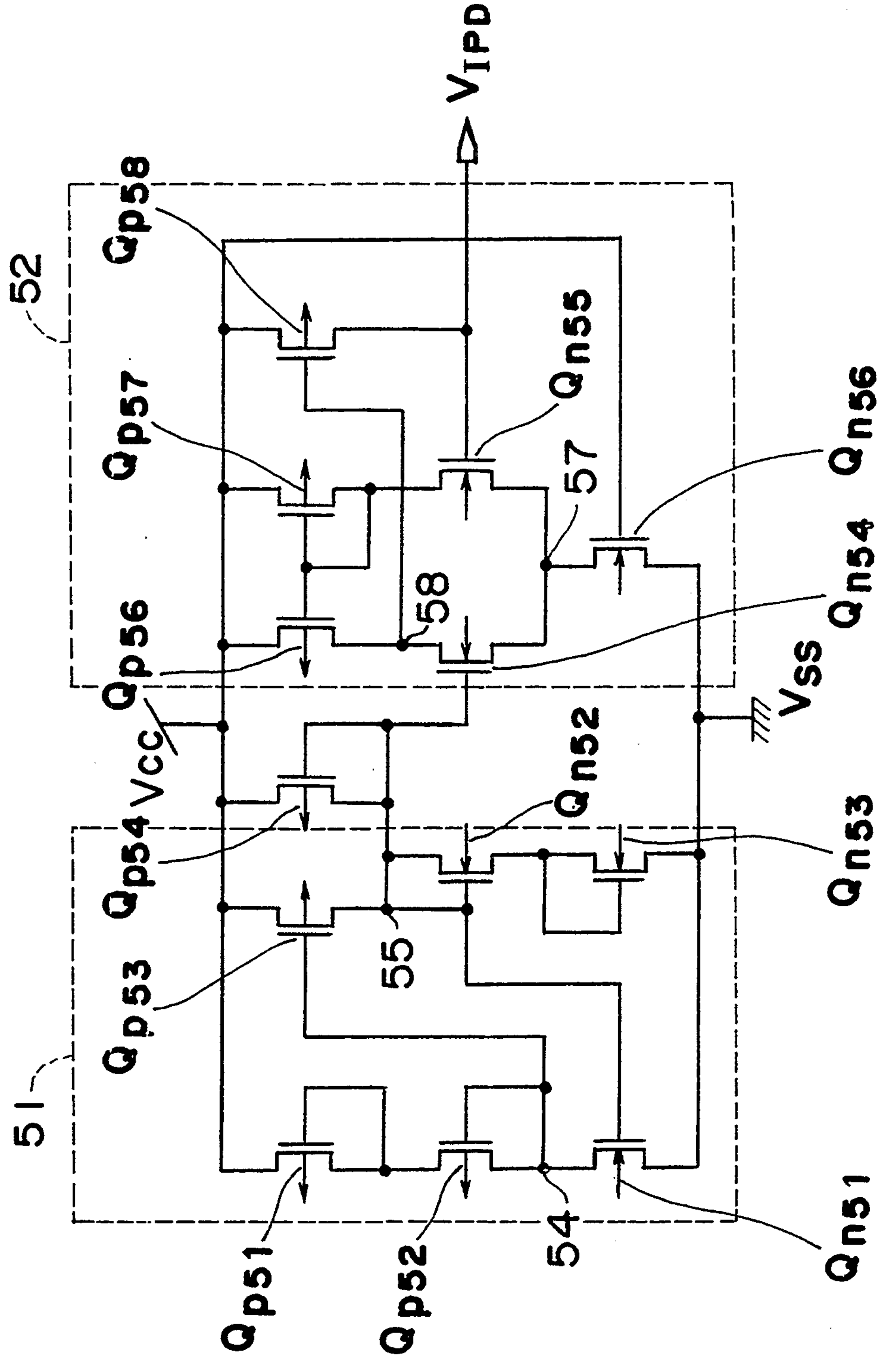
FIG. 5 is a circuit diagram of an internal substrate potential generator.

FIG. 5 shows a circuit diagram of the internal potential generator 41 as an internal voltage drop circuit for generating the internal supply potential $V_{IPD}$ to be supplied to the substrate potential detectors 42 and 44. The internal potential generator 41 generates a constant reference potential which is higher than the ground potential $V_{SS}$ by a prescribed potential and depends a little on the external power supply potential $V_{CC}$. The internal supply potential $V_{IPD}$ is generated with comparison to the reference potential so that the internal supply potential $V_{IPD}$ becomes also constant which depends a little of the external power supply voltage $V_{CC}$.

The internal potential generator 41 is composed of a reference potential generator 51 and a supplier 52. The reference potential generator 51 has three transistors $Q_{p51}$, $Q_{p52}$ and $Q_{n51}$ connected in series and three other transistors $Q_{p53}$, $Q_{n52}$ and $Q_{n53}$ connected in series. The two series connections are connected to the external power supply potential $V_{CC}$ in parallel. In the first series connection, the gate and the drain of the transistor $Q_{p51}$ are connected to each other, while those of the transistor $Q_{p52}$ are connected to each other and also to the gate of the transistor $Q_{p53}$. In the second series connection, a diode of a transistor $Q_{p54}$ wherein the gate and the drain are shorted is connected between the source and the drain of the transistor $Q_{p53}$. The drain and the gate of the transistor $Q_{n52}$ are connected to each other and to the gate of the transistor $Q_{n51}$, while the drain and the gate of the transistor $Q_{n53}$ are connected to each other.

The transistors $Q_{p51}$–$Q_{p54}$ and $Q_{n51}$–$Q_{n53}$ are all operated in the saturation region. In the reference potential generator 51, the reference potential depends a little on the external power supply potential $V_{cc}$ as will be explained below. If the potential at a connection point 55 is almost constant, the transistor $Q_{n51}$ acts in the saturation region because its gate potential is constant at the connection point 55. Further, because the source potential of the transistor $Q_{n51}$ is equal to the ground potential $V_{SS}$, the gate-to-source voltage of the transistor is almost constant so that the drain current $I_{dn51}$ is kept almost constant. The drain and gate potentials of the transistor $Q_{p52}$ when the drain currents $I_{dp51}$, $I_{dp52}$ and $I_{dn51}$ of the transistors $Q_{p51}$, $Q_{p52}$ and $Q_{n51}$ are equal to each other are the potential at a connection point 54 in the steady state. Therefore, the drain currents $I_{dp51}$ and $I_{p52}$ are almost equal to each other in the steady state. On the other hand, both drain currents $I_{dp51}$ and $I_{dp52}$ are determined almost by the gate-to-source voltages of the transistors $Q_{p51}$ and $Q_{p52}$ due to the operation in the saturation region, so that if both drain currents $I_{dp51}$ and $I_{dp52}$ are almost constant as mentioned above, the gate-to-source voltages of the transistors $Q_{p51}$ and $Q_{p52}$ are kept almost constant. Therefore, the potential difference between the connection point 54 and the external supply voltage $V_{CC}$, which is equal to the potential difference between the source of the transistor $Q_{p51}$ and the gate of the transistor $Q_{p52}$, is kept almost constant.

Further, the gate-to-source voltage of the transistor $Q_{p53}$, which is equal to the potential difference between the connection point 54 and the external potential $V_{CC}$, is kept almost constant as mentioned above, so that the drain current $I_{dp53}$ of the transistor $Q_{p53}$ is kept almost constant because of the operation in the saturation region. Still further, the drain and gate voltages of the transistor $Q_{n52}$ when the drain currents $I_{dp53}$, $I_{dn52}$ and $I_{dn53}$ of the transistors $Q_{p53}$, $Q_{n52}$ and $Q_{n53}$ are equal to each other, are equal to the potential at the connection point 55 in the steady state. Therefore, both drain currents $I_{dn52}$ and $I_{dn53}$ of the transistors $Q_{n22}$ and $Q_{n23}$ are kept almost constant in the steady state. On the other hand, the action of these transistors $Q_{n52}$ and $Q_{n53}$ are almost determined by their gate-to-source voltage in the saturation region, so that if both drain currents $I_{dn52}$ and $I_{dn53}$ are kept almost constant as mentioned above, the potential difference between the connection point 55 and the ground potential $V_{SS}$, which is equal to the potential difference between the gate of the transistor $Q_{n52}$ and the source of the transistor $Q_{n23}$, is kept almost constant.

As explained above, because the reference potential generator 51 has a feedback circuit, it is understood that the potential at the connection 54 becomes constant and lower than the external power supply potential $V_{CC}$ by a prescribed potential and that the potential at the connection point 55 becomes a reference potential which is constant and higher than the ground potential $V_{SS}$ by a prescribed potential. The reference potential is supplied to the supplier 52.

Next, the supplier 52 will be explained. A P-type transistor $Q_{p56}$ and an N-type transistor $Q_{n54}$ are connected in series, while a P-type transistor $Q_{p57}$ and an N-type transistor $Q_{n55}$ are also connected in series. Both series connections are connected in parallel to the external power supply potential $V_{CC}$ and the drain of the transistor $Q_{n56}$. An N-type transistor $Q_{n56}$ is connected between the ground potential $V_{SS}$ and the sources of the transistors $Q_{n54}$ and $Q_{n55}$. The gate of the transistor $Q_{n54}$ is connected to the connection point 55. The gate of the transistor $Q_{p56}$ is connected to both the gate and source of the transistor $Q_{p57}$. The gate of the transistor $Q_{n56}$ is connected to the source of the transistor $Q_{p58}$. A P-type MOS transistor $Q_{p58}$ is connected between the source of the transistor $Q_{p57}$ and the gate of the transistor $Q_{n55}$, while the gate of the transistor $Q_{p58}$ is connected to the drain of the transistor $Q_{p56}$. The potential $V_{IPD}$ at the drain of the transistor $Q_{p58}$ is supplied externally or to the first and second substrate potential detectors 42 and 44 as supply potential.

The above-mentioned supplier 52 is composed of a differential amplifier made of P-type MOS transistors $Q_{p56}$ and $Q_{p57}$ and N-type transistors $Q_{n54}$–$Q_{n56}$ and an output circuit made of a P-type MOS transistor $Q_{p58}$. In the differential amplifier, the transistors $Q_{p56}$ and $Q_{p57}$ has common source and gate potentials. Therefore, the drain currents $I_{dp56}$ and $I_{dp57}$ of both transistors $Q_{p56}$ and $Q_{p57}$ are equal to each other as a current mirror. The gate potential of the transistor $Q_{n54}$ is the reference potential which depends little on the external power supply potential $V_{CC}$, while the gate potential of the transistor $Q_{n55}$ is the internal drop potential $V_{IPD}$. The potential at the connection point 58 or the gate potential at the transistor $Q_{p58}$ is changed according to the comparison of the reference potential with the internal drop potential $V_{IPD}$ in order to control the output current from the output circuit.

If the internal drop potential $V_{IDP}$ (that is, the gate potential of the transistor $Q_{n55}$) is lower than the reference potential (that is, the gate potential of the transistor $Q_{n54}$), the drain current $I_{dn55}$ of the transistor $Q_{n55}$ decreases so as to increase the drain potential of the transistor $Q_{p57}$ and the drain potential of the transistor $Q_{n55}$ or the potential at the connection point 58. In other words, the drain current $I_{dp56}$ decreases because the gate potentials of the transistors $Q_{p56}$ and $Q_{p57}$ increase to decrease the gate-to-source voltage of the transistor $Q_{p56}$. Then, the potential of the connection point 57 which is equal to the drain potentials of the transistors $Q_{p56}$ and $Q_{n55}$ decreases. Thus, the potential at the connection point 58 or the gate potential of the transistor $Q_{p58}$ decreases so as to increase its gate-to-source voltage, so that the drain current $I_{dp58}$ of the transistor $Q_{p58}$ is increased.

On the other hand, when the internal drop potential $V_{IPD}$ is higher than the reference voltage, the drain current $I_{dn55}$ of the transistor $Q_{n55}$ increases in contrast to the above-mentioned case, to decrease the potential at the connection point 58. Then, the gate-to-source voltage of the transistor $Q_{p56}$ increases to increase its drain current $I_{dp56}$. Then, the potential at the connection point 57 increases to decrease the gate-to-source voltage of the transistor $Q_{p58}$ and the drain current $I_{dp58}$ of the transistor $Q_{p58}$ decreases. Especially, when the internal drop potential $V_{IPD}$ at the attains the prescribed set potential, the potential $V_{IPD}$ at the connection point 58 increases to turn off the transistor $Q_{p58}$ in order to prevent further increase in the internal drop potential $V_{IPD}$ over the set potential. Therefore, the internal drop potential $V_{IPD}$ can be kept equal to the set potential.

Figure 6:
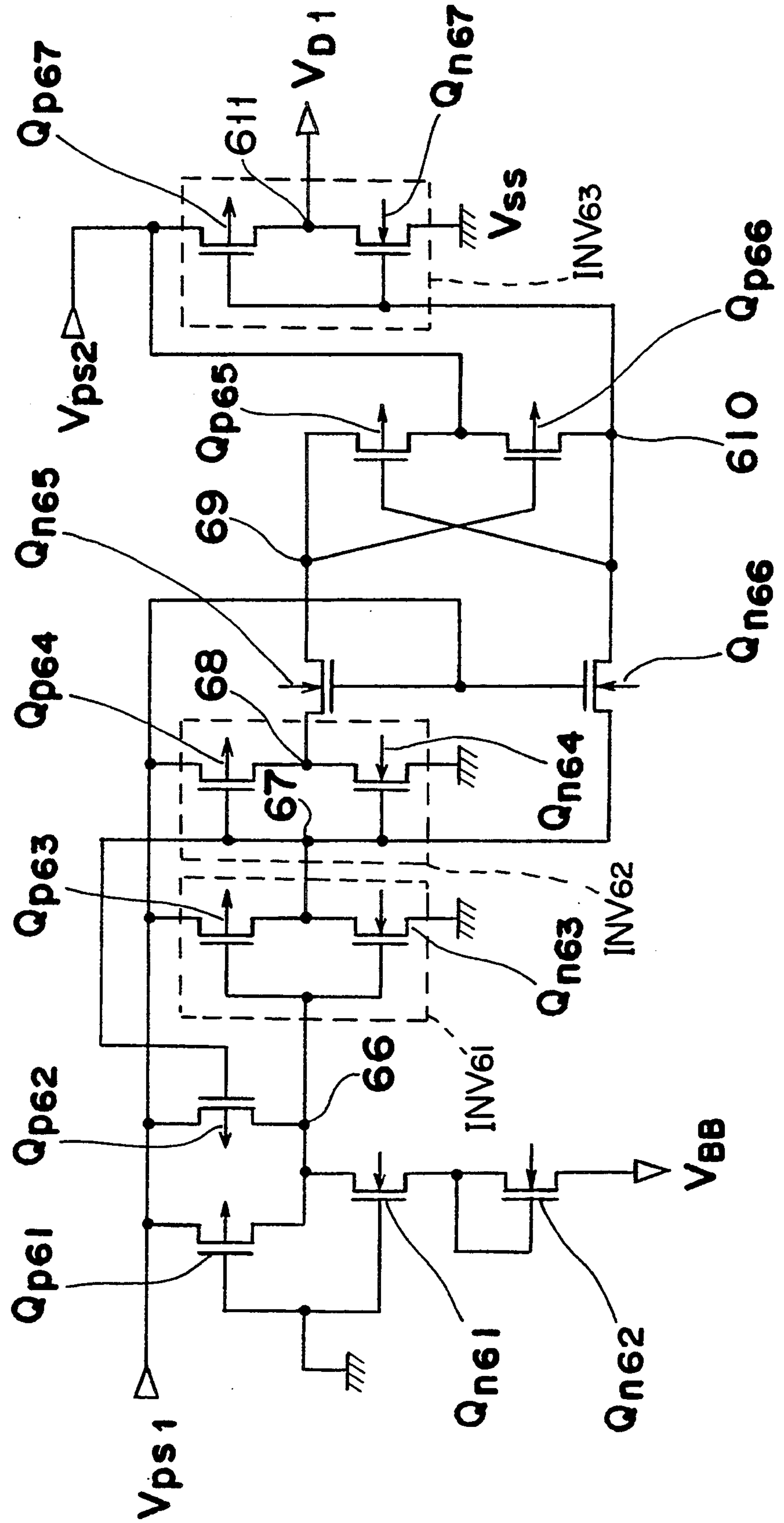
FIG. 6 is a circuit diagram of a first substrate potential detector.

Next, the action of the first substrate potential detector 42 will be explained below. FIG. 6 shows a circuit diagram of the first substrate potential detector 42 which consists of P-type transistors $Q_{p61}$ to $Q_{p64}$ and N-type transistors $Q_{n61}$–$Q_{n64}$. Two P-type MOS transistors $Q_{p61}$ and $Q_{p62}$ are connected in parallel between the first power supply potential $V_{pS1}$ and a connection point 66, while an N-type transistor $Q_{n61}$ and an N-type transistor $Q_{n62}$ are connected in series between the connection point 66 and the substrate potential $V_{BB}$. The gates of the transistors $Q_{p61}$ and $Q_{n61}$ are connected to the ground potential $V_{SS}$, while the gate and the source of the transistor $Q_{n62}$ are connected to each other. A P-type MOS transistors $Q_{p63}$ and an N-type MOS transistor $Q_{n63}$ are connected in series between the first power supply potential $V_{ps1}$ and the ground potential $V_{SS}$ and the gates of the two transistors $Q_{p63}$ and $Q_{n63}$ are connected to the connection point 66. A connection point 67 connecting the two transistors $Q_{p63}$ and $Q_{n63}$ composing an inverter $INV_{61}$ is connected for feedback to the gate of the transistor $Q_{p62}$. Another inverter $INV_{62}$ made of a P-type MOS transistor $Q_{p64}$ and an N-type MOS transistor $Q_{n64}$ connected in series via a connection point 68 is connected between the first power supply potential $V_{p1}$ and the ground potential $V_{SS}$, and the gates of the two transistors $Q_{p64}$ and $Q_{n64}$ are also connected to the connection point 67. The gates of N-type transistors $Q_{n65}$ and $Q_{n66}$ are connected to each other and also to the first power supply potential $V_{pS1}$. The sources of two P-type MOS transistors $Q_{p65}$ and $Q_{p66}$ are connected to a second power supply potential $V_{pS2}$, while their gates are connected to the drain of the other transistor of the two. The second power supply potential $V_{pS2}$ is a potential different from that of the first power supply potential, and it may be the external power supply potential $V_{cc}$. The transistors $Q_{n65}$, $Q_{p65}$, $Q_{p66}$ and $Q_{n66}$ are connected in series between the connection points 68 and 67. Then, a third inverter $INV_{63}$ made of a P-type MOS transistor $Q_{p67}$ and an N-type transistor $Q_{n67}$ connected in series is connected between the second power supply source $V_{pS2}$ and the ground potential $V_{SS}$. The gates of the two transistors $Q_{p67}$ and $Q_{n67}$ are connected to a connection point 610 or the drain of the transistor $Q_{p66}$. The potential at a connection point 611 of the two transistors $Q_{p67}$ and $Q_{n67}$ or the output of the inverter $INV_{63}$ is sent as the substrate potential detection signal $V_{D1}$ to the first substrate potential supplier 43. In this embodiment, the internal drop potential $V_{IPD}$ is supplied for the first power supply potential $V_{pS1}$.

Figure 7:
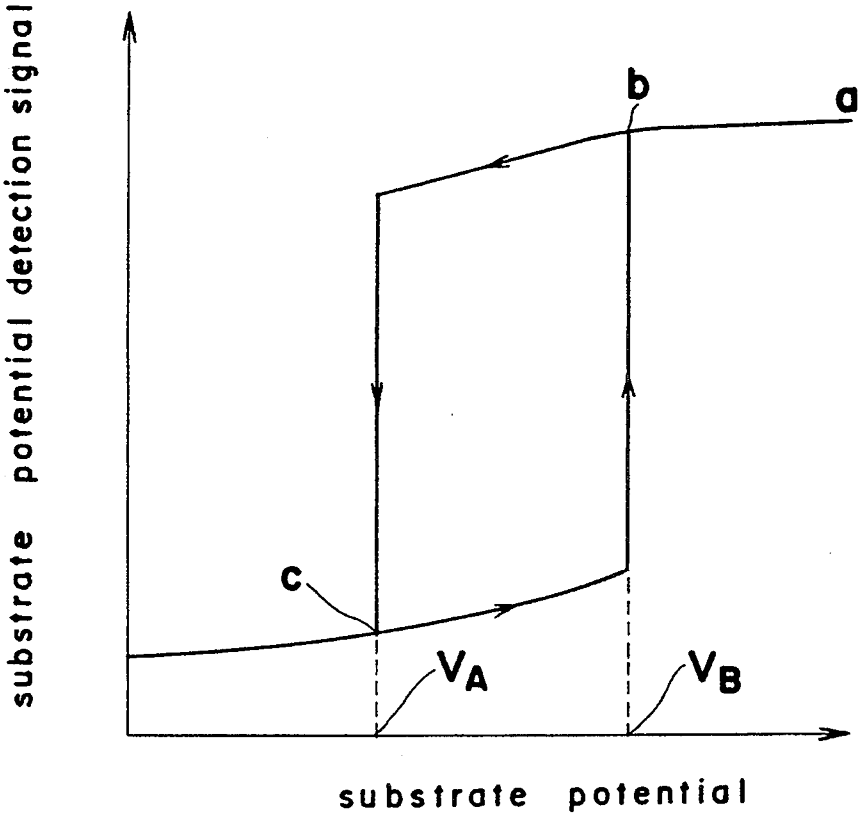
FIG. 7 is a graph of the hysteretic behavior of the first substrate potential detector.
Figure 8:
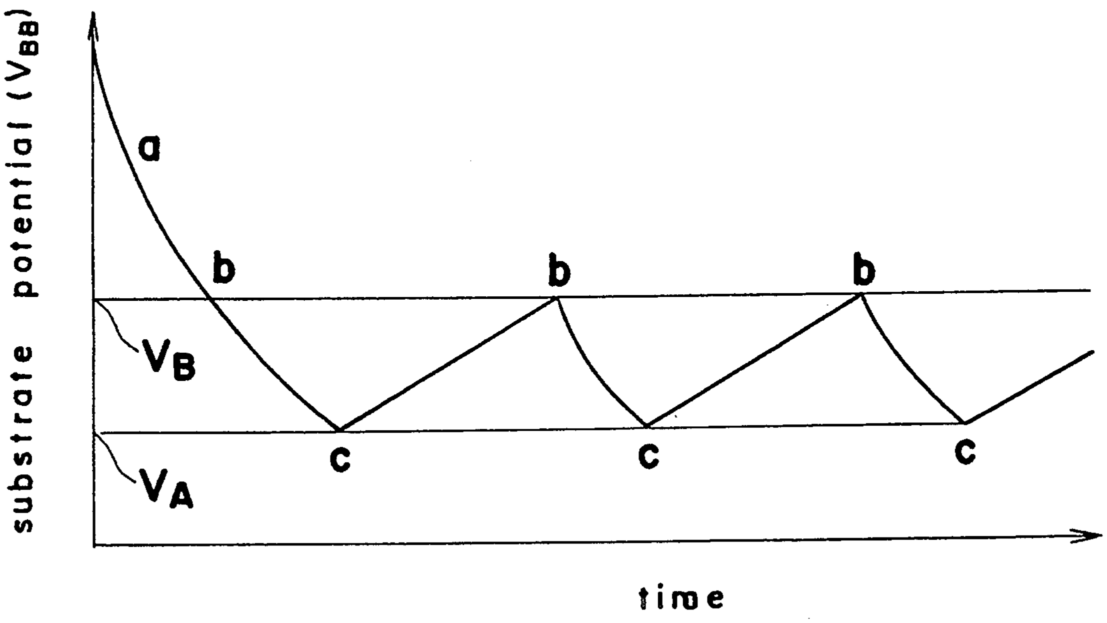
FIG. 8 is a graph of the temperature dependence of the substrate potential.

FIG. 7 shows a graph of the hysteretic characteristic of the substrate potential detection signal $V_{D1}$ of the first substrate potential detector 42, while FIG. 8 shows a graph of the characteristic of the substrate potential $V_{BB}$ generated by the first substrate potential supplier 43.

The first substrate potential detector 42 having the above-mentioned structure operates always to detect the substrate potential $V_{BB}$. The operation of the first substrate potential detector 42 will be explained below with reference to FIGS. 6 and 7. First, in the initial state after the electric power is turned on, the substrate potential $V_{BB}$ decreases due to the capacitance between the power supply and the substrate according to the increase in the external power supply potential $V_{CC}$, as shown in a period "a" to "b" in FIG. 7. However, in an ordinary semiconductor chip, there is necessarily a portion wherein the source potential of an N-type MOS transistor is connected to the ground potential to form a diode of P-N junction with the P-type substrate of the transistor. Then, the initial value of the substrate potential $V_{BB}$ is higher than the ground potential $V_{SS}$ at most by a P-N junction bias voltage. In this state, the gate potential of the MOS transistor $Q_{p61}$ is equal to the ground potential $V_{SS}$, the source potential thereof is equal to the first power supply potential $V_{pS1}$ and the gate-to-source potential thereof is lower than the threshold voltage of the transistor $Q_{p61}$ and nearly depends on the external power supply voltage $V_{CC}$. Therefore, the drain current $I_{dp61}$ flows nearly independently of the external power supply potential $V_{CC}$. On the other hand, the transistors $Q_{n61}$ and $Q_{n62}$ are turned off because the initial value of the substrate potential $V_{BB}$ is higher than the ground potential $V_{SS}$ at most by the P-N junction bias voltage. Thus, the potential at the connection point 66 or the drain potentials of the transistors $Q_{p61}$ and $Q_{n61}$ increases up to the first power supply potential $V_{pS1}$. Because the transistors $Q_{p63}$ and $Q_{n63}$ compose the inverter $INV_{61}$ with an input of the potential at the connection point 66, the connection point 67 or the output of the inverter $INV_{61}$ sends a low-level signal. Then, the transistor $Q_{p62}$ is turned on because the gate potential of the transistor $Q_{p62}$ is equal to the potential at the connection point 67. Further, because the transistors $Q_{p64}$ and $Q_{n64}$ compose of the inverter $INV_{62}$ with the input 67, the output 68 of the inverter $INV_{62}$ or the connection point 68 sends a high-level signal. Because the gate potentials of the transistors $Q_{n65}$ and $Q_{n66}$ are equal to the first power supply potential $V_{pS1}$, the two transistors are always turned on. Therefore, the potential of the connection point 69 connected with the connection point 68 through the transistor $Q_{n65}$ is decreased from the first supply potential $V_{pS1}$ by the threshold voltage of the transistor $Q_{n65}$ while the potential at the connection point 610 connected with the connection point 67 through the transistor $Q_{n66}$ is lowered to the ground potential $V_{SS}$. Because the transistor $Q_{p65}$ is connected between the second power supply potential $V_{pS2}$ and the connection point 69 and its gate is connected to the connection point 610, the transistor $Q_{P65}$ is turned on, and the potential at the connection point 69 is increased up to the second power supply potential $V_{pS2}$. Because the transistor $Q_{p66}$ is connected between the second power supply potential $V_{pS2}$ and the connection point 610 and its gate is connected to the connection point 69, the current flows through the transistor $Q_{p66}$ a little at first. However, the potential at the connection point 69 increases to the second power supply potential $V_{pS2}$ while the potential at the connection 610 is lowered by the transistors $Q_{n66}$ and $Q_{n63}$ to the ground potential $V_{SS}$, so that the transistor $Q_{p66}$ is turned off. Thus, the potential at the connection point 69 increases up to the first power supply potential $V_{pS1}$, while that at the connection point 610 decreases to the ground potential. Though the second power supply potential $V_{pS2}$ is lower than the first one $V_{pS1}$, the potential at the connection point 68 will not increase above the first power supply potential $V_{pS1}$ even when the potential at the connection point 69 is increased to the second power supply potential $V_{pS2}$ because the gate potential of the transistor $Q_{n65}$ is equal to the first power supply potential $V_{pS1}$. And, the output of the inverter $INV_{63}$ responds to the input or the potential at the connection point 610, and the substrate potential detection signal $V_{D1}$ becomes a high-level signal.

In the period "b" to "c" shown in FIGS. 7 and 8, the first substrate potential supplier 43 operates to lower the substrate potential $V_{BB}$. First, the decrease in the substrate potential $V_{BB}$ to the lower set potential $V_A$ will be explained below. In the first substrate potential detector 42, the gate potential of the transistor $Q_{p61}$ is equal to the ground potential $V_{SS}$, its source potential is equal to the first power supply potential $V_{pS1}$ or the internal drop potential $V_{IPD}$ and its gate-to-source voltage is an almost constant potential lower than the threshold voltage of the transistor $Q_{p61}$ independently of the external power supply potential $V_{CC}$, so that the drain current $I_{dp61}$ flows almost independently of the external power supply potential $V_{CC}$. As explained above, in the period "a" to "b", the gate potential of the transistor $Q_{p62}$ is equal to a low-level, its source potential is equal to the first power supply potential $V_{pS1}$ and its gate-to-source voltage is an almost constant potential lower than the threshold voltage of the transistor $Q_{p62}$ independently of the external power supply potential $V_{CC}$. Then, the transistor $Q_{p62}$ is turned on and the drain current flows through the transistor $Q_{p62}$ almost independently of the external power supply potential $V_{CC}$. Then, a subsequent current flows between the first power supply potential $V_{pS1}$ and the connection point 66 substantially independent of the external power supply potential $V_{CC}$:

$$I_{64\text{-}66(b\text{-}c)} = I_{dp61} + I_{dp62}.$$

And, the potential at the connection point 66 is equal to the potential realized when the drain currents $I_{dn61}$ and $I_{dn62}$ of the transistors $Q_{n61}$ and $Q_{n62}$ are equal to $I_{64\text{-}66(b\text{-}c)}$. When the substrate potential $V_{BB}$ becomes lower and the potential at the connection point 66 or the input potential of the inverter $INV_{61}$ composed of the transistors $Q_{p63}$ and $Q_{n63}$ attains a potential to invert the output of the inverter $INV_{61}$ or a so-called threshold voltage of the inverter $INV_{61}$, the drain currents $I_{dn61}$ and $I_{dn62}$ of the transistors $Q_{n61}$ and $Q_{n62}$ can be expressed as follows:

$$I_{dn61} = \beta(-V_{68} - V_{tn61})^2$$

and $$I_{dn62} = \beta((V_{68} - V_{BB}) - V_{tn62})^2,$$

wherein $V_{tn61}$ and $V_{tn62}$ designate the threshold voltages of the transistors $Q_{n61}$ and $Q_{n62}$, respectively. Then, the potential at the connection point 66 or the drain potentials of the three transistors $Q_{p61}$, $Q_{p62}$ and $Q_{n61}$ attains a potential to invert the output of the inverter $INV_{61}$ or to the so-called threshold voltage of the inverter $INV_{61}$, the substrate potential $V_{BB}$ has to decrease until the sum of the drain currents $I_{dp61}$ and $I_{dp62}$ of the transistors $Q_{p61}$ and $Q_{p62}$ being almost independent of the external power supply potential $V_{CC}$ becomes equal to the drain currents $I_{dn61}$ and $I_{dn62}$ of the transistors $Q_{n61}$ and $Q_{n62}$:

Therefore, the output of the inverter $INV_{61}$ is inverted when the substrate potential $V_{BB}$ decreases to the lower set potential $V_A$. Then, after the substrate potential $V_{BB}$ is decreased to the lower set potential $V_A$ as shown in the period "b" to "c" in the graph of FIG. 7, the output of the inverter $INV_{61}$ made of the transistors $Q_{p63}$ and $Q_{n63}$ or the connection point 67 sends a high-level signal because the connection point 66 is the input of the inverter. Thus, because the connection point 67 is the gate of the transistor $Q_{p62}$, the transistor $Q_{p62}$ is turned off. Further, because the transistors $Q_{p64}$ and $Q_{n64}$ make up the inverter $INV_{62}$ with the connection point 67 as the input, the connection point 68 becomes a low-level signal. Further, the gate potentials of the transistors $Q_{n65}$ and $Q_{n66}$ are equal to the first power supply potential $V_{pS1}$ so that they are always in the on state. Then, the potential at the connection point 610 connected with the connection point 67 through the transistor $Q_{n66}$ is increased from the first power supply potential $V_{pS1}$ by the threshold voltage of the transistor $Q_{n66}$, and the potential of the connection point 69 connected with the connection point 68 through the transistor $Q_{n65}$ is decreased to the ground potential $V_{SS}$. Further, because the transistor $Q_{p66}$ is connected between the second power supply potential $V_{pS2}$ and the connection point 610 and its gate is connected to the connection point 69, the transistor $Q_{p66}$ is in the on state and the potential at the connection point 610 is increased to the second power supply potential $V_{pS2}$. On the other hand, the transistor $Q_{p65}$ is connected between the second power supply potential $V_{pS2}$ and the connection point 69 and its gate is connected to the connection point 610, a current flows a little at first through the transistor $Q_{p65}$. However, the transistor $Q_{p65}$ is turned off because the potential at the connection point 610 increases to the second power supply potential $V_{pS2}$ and the potential at the connection point 69 is decreased to the ground potential $V_{SS}$ by the transistors $Q_{n65}$ and $Q_{n64}$. Thus, the potential at the connection point 610 is increased to the first power supply potential $V_{pS1}$ while the potential at the connection point 69 is decreased to the ground potential $V_{SS}$. Though the second power supply potential $V_{pS2}$ is lower than the first one $V_{pS1}$, the potential at the connection point 67 is not increased above the first power supply potential $V_{pS1}$ even when the potential at the connection point 610 is increased to the second power supply potential $V_{pS2}$ because the gate potential of the transistor $Q_{n66}$ is equal to the first power supply potential $V_{pS1}$. Further, the substrate potential detection signal $V_{D1}$ which is the output of the inverter $INV_{63}$ with the input 610 becomes a low-level. Therefore, drain currents $I_{dp61}$, $I_{dp62}$, $I_{dn61}$ and $I_{dn62}$ all depend little on the external power supply potential $V_{CC}$, so that the lower set potential $V_A$ also depends little on the external power supply potential. If the connection point 67 where the input of the inverter $INV_{63}$, both transistors $Q_{p67}$ and $Q_{n67}$ would turned on at the same time to generate through current. However, in the structure of the above-mentioned embodiment, the potential at the connection point 68 will not increase above the first power supply potential $V_{pS1}$ while the potential at the connection point 611 increases up to the second power supply potential $V_{pS2}$, so that the through current will not be kept to be as-generated.

In the period "c" to "b" shown in FIGS. 7 and 8, the first substrate potential supplier 43 ceases to operate to increase the substrate potential $V_{BB}$ due to the substrate current of the N-type MOS transistors, noises of other supplies or the like. First, the floating of the substrate potential $V_{BB}$ up to the upper set potential $V_B$ will be explained below. In the first substrate potential detector 42, the gate potential of the transistor $Q_{p61}$ is equal to the ground potential $V_{SS}$, its source potential is equal to the first power supply potential $V_{pS1}$ and its gate-to-source voltage is an almost constant potential lower than the threshold voltage of the transistor $Q_{p61}$ independently of the external power supply potential $V_{CC}$, so that a drain current $I_{dp61}$ flows almost independently of the external power supply potential $V_{CC}$. As explained above, in the point "c", the gate potential of the transistor $Q_{p62}$ is equal to a high-level, so that the transistor $Q_{p62}$ is turned off and the drain current does not flow through the transistor $Q_{p62}$. Then, a subsequent current flows between the first power supply potential $V_{pS1}$ and the connection point 66 substantially independently of the external power supply potential $V_{CC}$:

$$I_{64\text{-}66(b\text{-}c)}=I_{dp61}.$$

And, the potential at the connection point 66 is equal to the potential realized when the drain currents $I_{dn61}$ and $I_{64\text{-}66(b\text{-}c)}$ are equal to each other. When the substrate potential becomes high and the potential at the connection point 66, or the input potential of the inverter $INV_{61}$ composes of the transistors $Q_{p63}$ and $Q_{n63}$, attains a potential to invert the output of the inverter $INV_{61}$ or a so-called threshold voltage of the inverter $INV_{61}$, the drain currents $I_{dn61}$ and $I_{dn62}$ of the transistors $Q_{n61}$ and $Q_{n62}$ can be expressed as follows:

$$I_{dn61}=\beta(-V_{68}-V_{tn61})^2$$

and $$I_{dn62}=\beta((V_{68}-V_{BB})-V_{tn62})^2,$$

wherein $V_{tn61}$ and $V_{tn62}$ designate the threshold voltages of the transistors $Q_{n61}$ and $Q_{n62}$, respectively. Therefore, the potential at the connection point 66 or the drain potentials of the three transistors $Q_{p61}$, $Q_{p62}$ and $Q_{n61}$ attains a potential to invert the output of the inverter $INV_{61}$ or to the so-called threshold voltage of the inverter $INV_{61}$, the substrate potential $V_{BB}$ increases until the drain current $I_{dp61}$ of the transistor $Q_{p61}$ being almost independent of the external power supply potential $V_{CC}$ becomes equal to the drain currents $I_{dn61}$ and $I_{dn62}$ of the transistors $Q_{n61}$ and $Q_{n62}$:

$$I_{dp61}=I_{dn61}=I_{dn62}.$$

Therefore, when the output of the inverter $INV_{61}$ is inverted, the transistor $Q_{p62}$ is in the off state so that the drain currents of the transistors $Q_{n61}$ and $Q_{n62}$ can be smaller by the drain current $I_{dp62}$ than in the period "b" to "c", and the substrate potential $V_{BB}$ floats up to the upper set potential $V_B$. Then, when the operation of the first substrate potential supplier 43 is stopped and the substrate potential $V_{BB}$ floats up as shown in the period "c" to "b" in the graph of FIG. 7, after the substrate potential $V_{BB}$ is decreased down to the upper set potential $V_B$, the output, or the connection point 67 of the inverter $INV_{61}$ made of the transistors $Q_{p63}$ and $Q_{n63}$, sends a low-level signal because the connection point 66 is the input of the inverter. Thus, because the connection point 67 is the gate of the transistor $Q_{p62}$, the transistor $Q_{p62}$ is in the on state. Further, because the transistors $Q_{p64}$ and $Q_{n64}$ make up the inverter $INV_{62}$ with the connection point 67 as the input, the potential at the connection point 68 is a high-level signal. Further, the gate potentials of the transistors $Q_{n65}$ and $Q_{n66}$ are equal to the first power supply potential $V_{pS1}$ so that they are always in the on state. Then, the potential at the connection point 69 connected with the connection point 68 through the transistor $Q_{n65}$ is increased to a value smaller than the first power supply potential $V_{pS1}$ by the threshold voltage of the transistor $Q_{n65}$, and the potential of the connection point 610 connected with the connection point 67 through the transistor $Q_{n66}$ is decreased to the ground potential $V_{SS}$. Further, because the transistor $Q_{p65}$ is connected between the second power supply potential $V_{pS2}$ and the connection point 69 and its gate is connected to the connection point 610, the transistor $Q_{p65}$ is in the on state and the potential at the connection point 69 is increased to the second power supply potential $V_{pS2}$. On the other hand, the transistor $Q_{p66}$ is connected between the second power supply potential $V_{pS2}$ and the connection point 610 and its gate is connected to the connection point 69, a current flows a little at first through the transistor $Q_{p66}$. However, the transistor $Q_{p66}$ enters the off state because the potential at the connection point 69 increases to the second power supply potential $V_{pS2}$ and the potential at the connection point 610 is decreased to the ground potential $V_{SS}$ by the transistors $Q_{n66}$ and $Q_{n63}$. Thus, the potential at the connection point 69 is increased to the first power supply potential $V_{pS1}$ while the potential at the connection point 610 is decreased to the ground potential $V_{SS}$. Though the second power supply potential $V_{pS2}$ is lower than the first one $V_{pS1}$, the potential at the connection point 68 does not increase above the first power supply potential $V_{pS1}$ even when the potential at the connection point 69 is increased to the second power supply potential $V_{pS2}$ because the gate potential of the transistor $Q_{n65}$ is equal to the first power supply potential $V_{pS1}$. Further, the substrate potential detection signal $V_{D1}$ which is the output of the inverter $INV_{63}$ with the input 610 becomes a high-level. At the same time, the output of the inverter $INV_{61}$ or the gate potential of the transistor $Q_{p62}$ is inverted to a low-level, so that the transistor $Q_{p62}$ is turned on. Therefore, the drain currents $I_{dp61}$, $I_{dp62}$, $I_{dn61}$ and $I_{dn62}$ all depend little on the external power supply potential $V_{CC}$, so that the upper set potential $V_B$ also depends little on the external power supply potential.

As explained above, in the period "b" to "c" in FIGS. 7 and 8 when the first substrate potential detection signal $V_{D1}$ is a high-level to operate the first substrate potential supplier 43 so as to lower the substrate potential $V_{BB}$, the substrate potential $V_{BB}$ is lowered to the lower set potential $V_A$ which depends little on the external power supply potential $V_{CC}$. On the other hand, in the period "c" to "b" when the first substrate potential detection signal is a low-level, the operation of the first substrate potential supplier 43 is stopped to float up the substrate potential $V_{BB}$, after the substrate potential $V_{BB}$ floats up to the upper set potential $V_B$ which depends little on the external potential $V_{CC}$, the substrate potential supplier 43 is started to lower the substrate potential $V_{BB}$. The periods "b" to "c" and "c" to "b" are repeated, as shown in FIG. 8, to realize the hysteretic behavior as shown in FIG. 7. Thus, the wasteful through current is prevented to be kept flowing as-generated.

Figure 9:
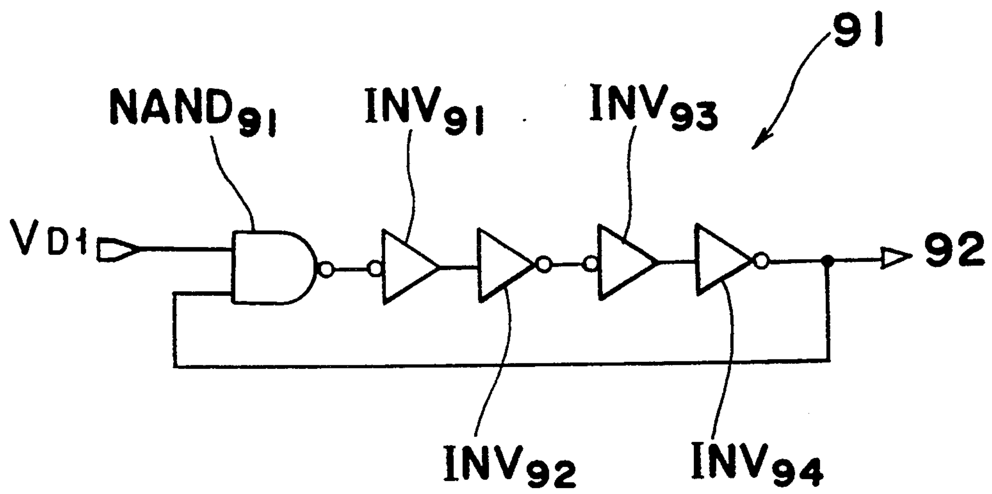
FIGS. 9(*a*) and (*b*) are a circuit diagram of a first substrate potential supplier.
Figure 9:
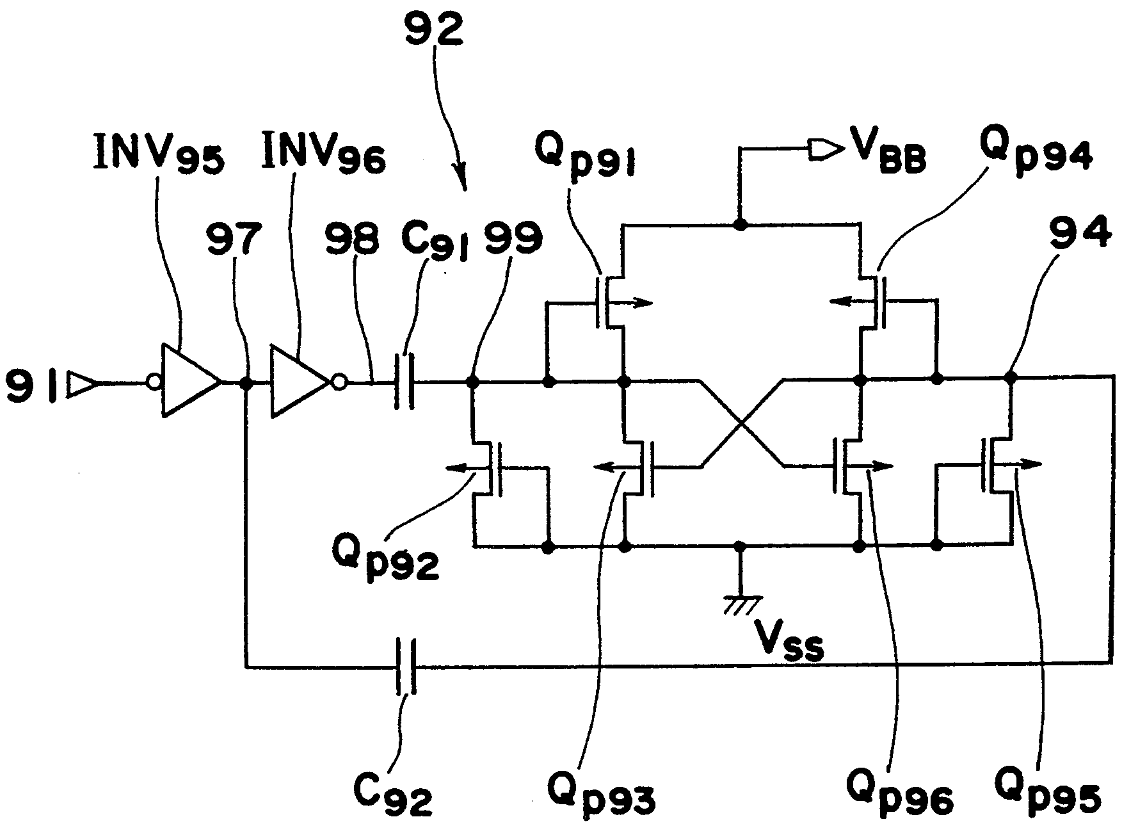
Figure 10:
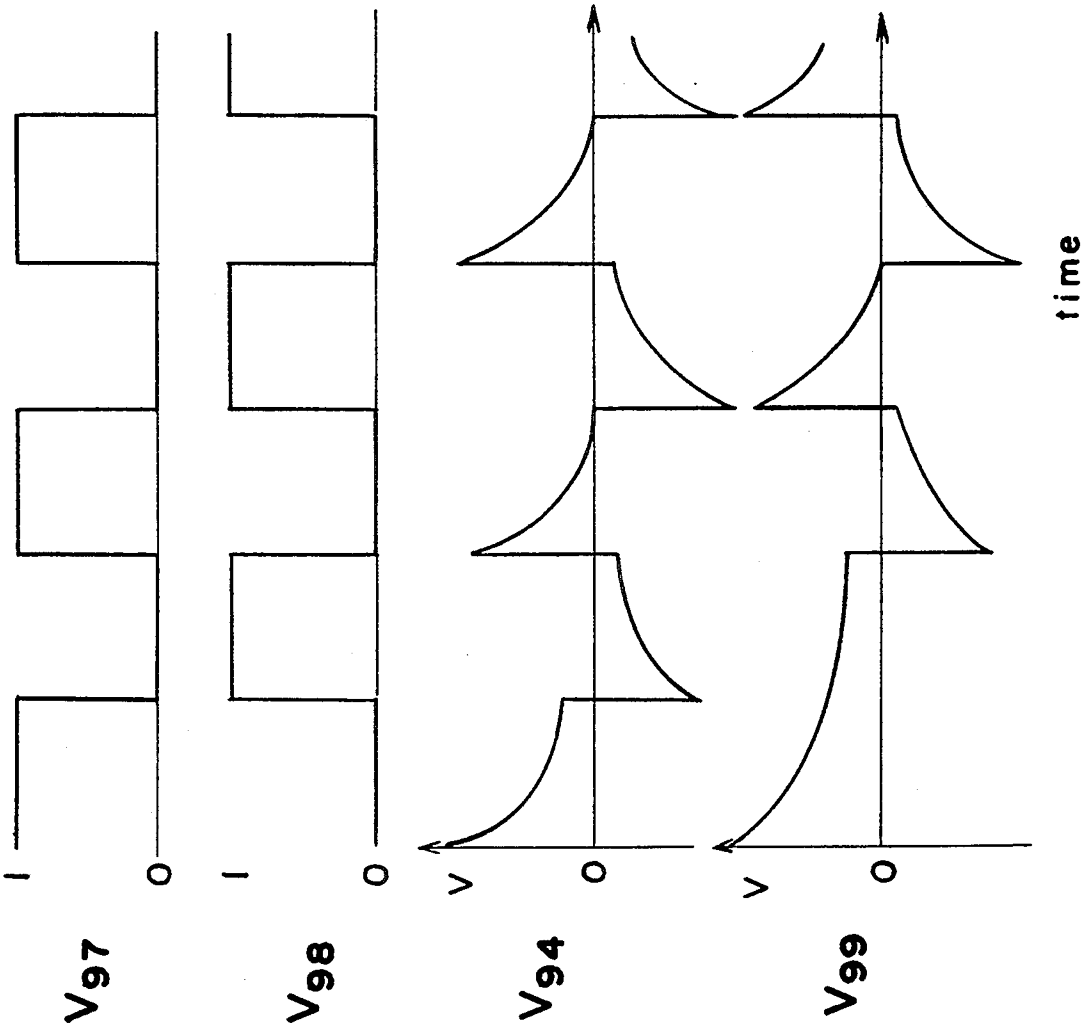
FIG. 10 is a graph of the characteristics of the first substrate potential supplier.

Next, the substrate potential supplier 43 will be explained below. The substrate potential supplier 43 consists of a pulse generator 91 for driving the substrate potential supplier and a charge pump 92. As shown in FIGS. 9(*a*) and 9(*b*) respectively, the substrate potential supplier 43 comprises a pulse generator 91 composed of inverters $INV_{91}$–$INV_{94}$ and an NAND gate $NAND_{91}$ and a charge pump 92 composed of P-type MOS transistors $Q_{p91}$ to $Q_{p96}$, capacitors $C_{91}$ and $C_{92}$ and inverters $INV_{95}$ and $INV_{96}$. FIG. 10 shows a graph of the characteristic of the pulse generator 91.

First, the operation of a ring oscillator used as the pulse generator 91 will be explained. The ring oscillator consists of a NAND gate $NAND_{91}$, having as inputs the substrate potential generator control signal $V_{D1}$ and the output of the inverter $INV_{94}$, and an inverter chain of four inverters $INV_{91}$–$INV_{94}$. When the control signal $V_{D1}$ is a high-level, a signal waveform is generated as a pump capacitor driving pulse while when the control signal is a low-level to stop the oscillation, a high level is outputted as the driving pulse.

Next, the charge pump 92 will be explained below. In the charge pump 92, the inverter $INV_{95}$ receives the driving pulse from the ring oscillator. The capacitor $C_{92}$ is connected between the output of the inverter $INV_{95}$ or the connection point 97. The input of the inverter $INV_{96}$ is connected to the connection point 97 and the output of the inverter $INV_{96}$ is connected to the capacitor $C_{91}$ through a connection point 98. The capacitor $C_{91}$ is also connected through a connection point 99 to the gate and the drain of the MOS transistor $Q_{p91}$ while the source of the transistor $Q_{p91}$ is connected to the substrate potential $V_{BB}$. The source of the transistor $Q_{p92}$ is also connected to the connection point 99, while the gate and the drain of the transistor $Q_{p92}$ are connected to the ground potential $V_{SS}$. The source of the transistor $Q_{p93}$ is also connected to the connection point 99, while the drain of the transistor $Q_{p93}$ is connected to the ground potential $V_{SS}$. The gate of the transistor $Q_{p93}$ is connected to a connection point 94. On the other hand, the capacitor $C_{92}$ is also connected through the connection point 94 to the gate and the drain of the transistor $Q_{p94}$ while its source is connected to the substrate potential $V_{BB}$. The source of the transistors $Q_{p95}$ and $Q_{p96}$ are connected to the connection point 94, while the drains of the two transistors and the gate of the transistor $Q_{p95}$ are connected to the ground potential $V_{SS}$. The gate of the transistor $Q_{p96}$ is connected to the connection point 99. Thus, the transistors $Q_{p91}$–$Q_{p93}$ and the capacitor $C_{91}$ construct a circuit similar to that of the transistors $Q_{p94}$–$Q_{p96}$ and the capacitor $C_{92}$ except for the connection with the inverter $INV_{96}$.

In the charge pump 92 constructed as explained above, when the substrate potential detection signal is a high-level or when a pulse waveform as the driving pulse is received, the inverter $INV_{96}$ sends the inverted waveform of the driving pulse, and then the inverter $INV_{97}$ sends the pulse waveform in the same phase as that of the input driving pulse. Therefore, as shown in FIG. 10, when the driving pulse is increased from the ground potential $V_{SS}$ to the power supply potential $V_{CC}$, the potential $V_{97}$ at the connection point 97 or the output of the inverter $INV_{95}$ decreases to the ground potential $V_{SS}$, while the potential $V_{98}$ at the connection point 98 or the output of the inverter $INV_{96}$ increases from the ground potential $V_{SS}$ to the external power supply potential $V_{CC}$. Therefore, the potential $V_{99}$ at the connection point 99 increases due to the coupling of the capacitor $C_{91}$ by the power supply potential $V_{CC}$ from the potential attained before the driving pulse rises from the ground potential $V_{SS}$ to the power supply potential $V_{CC}$, while the potential $V_{94}$ at the connection point 94 decreases due to the coupling of the capacitor $C_{92}$ by the power supply potential $V_{CC}$ from the potential attained before the driving pulse rises from the ground potential $V_{SS}$ to the power supply potential $V_{CC}$.

As explained above, when the driving pulse rises from the ground potential $V_{SS}$ to the power supply potential $V_{CC}$, the potential $V_{99}$ at the connection point 99 increases almost by the power supply potential $V_{CC}$ from the value of the potential $V_{99}$ just before the rise of the driving pulse, so that positive charges stored in the capacitance of the connection point 99 are extracted by the transistor $Q_{p92}$ till a potential higher than the ground potential $V_{SS}$ by the threshold voltage of the transistor $Q_{p92}$.

Further, when the driving pulse is decreased from the power supply potential $V_{CC}$ to the ground potential $V_{SS}$, the potential $V_{97}$ at the connection point 97 or the output of the inverter $INV_{95}$ rises from the ground potential $V_{SS}$ up to the power supply potential $V_{CC}$, while the potential $V_{98}$ at the connection point 98 or the output of the inverter $INV_{96}$ falls from the power supply potential $V_{CC}$ to the ground potential $V_{SS}$. Therefore, the potential $V_{99}$ at the connection point 99 decreases due to the coupling of the capacitor $C_{91}$ by the power supply potential $V_{CC}$ from the potential attained before the driving pulse rises from the ground potential $V_{SS}$ to the power supply potential $V_{CC}$, while the potential $V_{94}$ at the connection point 94 decreases due to the coupling of the capacitor $C_{92}$ by the power supply potential $V_{CC}$ from the potential attained before the driving pulse rises from the ground potential $V_{SS}$ to the power supply potential $V_{CC}$.

As explained above, when the driving pulse falls from the power supply potential $V_{CC}$ to the ground potential $V_{SS}$, the potential $V_{99}$ at the connection point 99 decreases almost by the power supply potential $V_{CC}$ from the value of the potential higher by the threshold voltage of the transistor $Q_{p92}$ than the ground potential $V_{SS}$. Thus, the potential $V_{99}$ at the connection point 99 can be expressed by a following formula:

$$-(V_{CC}-V_t(Q_{p92})),$$

wherein $V_t(Q_{p92})$ designates the threshold voltage of the transistor $Q_{p92}$. Therefore, the transistor $Q_{p91}$ is turned on, so that negative charges are supplied to the capacitor of the substrate potential $V_{BB}$ to lower the substrate potential $V_{BB}$. At the same time, because the driving pulse falls from the power supply potential $V_{CC}$ to the ground potential $V_{SS}$, the potential $V_{94}$ at the connection point 94 increases almost by the power supply potential $V_{CC}$ from the value just before the fall of the driving pulse, so that positive charges are extracted by the transistor $Q_{p95}$ to a potential higher than the ground potential $V_{SS}$ by the threshold voltage of the transistor $Q_{p95}$. Thus, the potential $V_{99}$ at the connection point 99 can be expressed by a following formula:

$$-(V_{CC}-V_t(Q_{p95})),$$

wherein $V_t(Q_{p95})$ designates the threshold voltage of the transistor $Q_{p95}$. Therefore, positive charges are extracted by the transistor $Q_{p96}$ to the ground potential $V_{SS}$. That is, the potential at the connection point 94 is decreased to the ground potential $V_{SS}$.

Then, the driving pulse rises again from the ground potential $V_{SS}$ to the power supply potential $V_{CC}$, and the potential $V_{94}$ at the connection point 94 decreases almost by the power supply potential $V_{CC}$ from the ground potential $V_{SS}$ or the value of the potential at the connection point 94. Thus, the potential $V_{94}$ at the connection point 94 can be expressed as $-V_{CC}$. Therefore, the transistor $Q_{p94}$ is turned on, so that negative charges are supplied to the capacitance of the substrate potential $V_{BB}$ to lower the substrate potential $V_{BB}$. At the same time, because the driving pulse falls from the power supply potential $V_{CC}$ to the ground potential $V_{SS}$, the potential $V_{99}$ at the connection point 99 increases almost by the power supply potential $V_{CC}$ from the value of the potential at the connection point 99 just before the fall of the driving pulse, so that positive charges are extracted by the transistor $Q_{p92}$ to a potential higher than the ground potential $V_{SS}$ by the threshold voltage of the transistor $Q_{p92}$. Thus, the potential $V_{94}$ at the connection point 94 can be expressed as $-V_{CC}$. Therefore, positive charges are extracted by the transistor $Q_{p93}$ to the ground potential $V_{SS}$. That is, the potential $V_{99}$ at the connection point 99 is decreased to the ground potential $V_{SS}$.

Then, the driving pulse falls again from the power supply potential $V_{CC}$ to the ground potential $V_{SS}$, and the potential $V_{99}$ at the connection point 99 decreases almost by the power supply potential $V_{CC}$ from the ground potential $V_{SS}$ or the value of the potential $V_{99}$ just before the rise. Then, the transistor $Q_{p91}$ is turned on, so that negative charges are supplied to the capacitor of the substrate potential $V_{BB}$ to lower the substrate potential $V_{BB}$. At the same time, because the driving pulse falls from the power supply potential $V_{CC}$ to the ground potential $V_{SS}$, the potential $V_{94}$ at the connection point 94 increases almost by the power supply potential $V_{CC}$ from the value just before the fall, so that positive charges are extracted by the transistor $Q_{p94}$ to a potential higher than the ground potential $V_{SS}$ by the threshold voltage of the transistor $Q_{p94}$. Thus, the potential $V_{97}$ at the connection point 97 becomes $-V_{CC}$. Therefore, positive charges are extracted by the transistor $Q_{p96}$ to the ground potential $V_{SS}$. That is, the potential $V_{97}$ at the connection point 97 is decreased to the ground potential $V_{SS}$.

By repeating the above-mentioned operation, as long as a pulse waveform of the driving pulse is inputted, the potentials at the connection points 94 and 96 or the source potentials of the transistors $Q_{p91}$ and $Q_{p94}$ decrease the lowest to $-V_{CC}$. Thus, the substrate potential $V_{BB}$ is decreased to a potential higher than the potentials at the connecting points 94, 99 by the threshold voltage of the transistors $Q_{p91}$ and $Q_{p94}$. Thus, the substrate potential $V_{BB}$ can be lowered to potentials expressed as $$-(V_{CC}-V_t(Q_{p91})),$$

and $$-(V_{cc}-V_t(Q_{p94})),$$

wherein $V_t(Q_{p91})$ and $V_t(Q_{p94})$ designate the threshold voltages of the transistor $Q_{p91}$ and $Q_{p94}$.

On the other hand, when the driving pulse is fixed at a high-level, the potential at the connection point 97 or the output of the inverter $INV_{95}$ is fixed at a high-level. Therefore, the above-mentioned pumping action is not performed and the supply of negative charges to the substrate is stopped.

To sum up, in the initial state, for example when the power supply is turned on, the substrate potential $V_{BB}$ is decreased gradually as shown in the period "a" to "b" in FIG. 8. In the period "b" to "c" in FIGS. 7 and 8 when the first substrate potential detection signal $V_{D1}$ is a high-level to operate the first substrate potential supplier 43 in order to lower the substrate potential $V_{BB}$, the substrate potential $V_{BB}$ is lowered to the lower set potential $V_A$ which depends little on the external power supply potential $V_{CC}$. On the other hand, in the period "c" to "b" when the first substrate potential detection signal $V_{D1}$ is a low-level to stop the operation of the first substrate potential supplier 43 in order to increase the substrate potential $V_{BB}$, after the substrate potential $V_{BB}$ is allowed to increase up to the upper set potential $V_B$ which depends little on the external supply potential $V_{CC}$, the substrate potential supplier 43 is started to lower the substrate potential $V_{BB}$. The periods "b" to "c" and "c" to "b" are repeated, as shown in FIG. 8, to realize a hysteretic behavior as shown in FIG. 7. Thus, the first substrate potential detector 42 does not detect the lower substrate potential detection signal according to a set potential as in a prior art substrate potential generator. On the contrary, the set potential when the first substrate potential supplier 43 is activated or negative charges are injected to the substrate potential $V_{BB}$ is made higher than the set potential when the first substrate potential supplier 43 is deactivated. Therefore, when the first substrate potential supplier 43 is under operation, its operation is stopped only after the substrate potential $V_{BB}$ decreases to the lower set potential $V_A$, while when the first substrate potential supplier 43 is not under operation, its operation is started only after the substrate potential $V_{BB}$ floats up to the upper set potential $V_B$. Such operation of the first substrate potential supplier 43 results in the hysteretic behavior. Therefore, frequent stop and start repetitions are prevented, and the dissipation current of the substrate potential generator can be decreased because charge current and discharge current of the capacitances of the signal lines, transistors or the like can be decreased.

Next, the other components shown in FIG. 4 which have not yet been explained will be explained below: namely, the second substrate potential supplier 45, the control signal generator 46 for generating control signal to control the second substrate potential detector 44, and the second substrate potential detector 44.

As already explained above with reference to FIG. 4, in order to enhance the amount of negative charges to be supplied to the substrate without dissipating wasteful current, two kinds of substrate potential suppliers 43 and 45 are provided in this embodiment. The second substrate potential supplier 45 can supply a larger amount of negative charges though the dissipating current is larger, and it is used when a large quantity of negative charges are required to be supplied, for example when the substrate potential $V_{BB}$ has to be lowered in a short period such as after the power supply is turned on or when large substrate current is generated in a peripheral or the like. Further, two kinds of substrate potential detectors 42 and 44 are provided. Then, when the second substrate potential supplier 45 using a larger amount of current is operated, the second substrate potential detector 44 is used which can respond fast though the dissipation current is larger. Then, the dissipating current of the substrate potential generator can be made smaller as a whole while the performance on the supply of negative charges is not degraded. The control signal generator supplies a control signal to the second substrate potential detector when the substrate potential has to be increased quickly.

The structure of the circuit of the second substrate potential supplier 45 is the same as that of the first one 43 except that the capacitances of the capacitors $C_{91}$ and $C_{92}$ are larger than the counterparts of the first substrate potential supplier 43 and that the performance on supply current and response time of the transistors $Q_{p91}$ and $Q_{p94}$ are more enhanced than the counterparts of the first substrate potential supplier 43. Therefore, the operation of the second substrate potential supplier 45 is the same as that of the first one 43. However, the amount of negative charges which can be supplied to the substrate in a period of a driving pulse is larger than that of the first substrate potential supplier 43. Thus, the substrate potential can be decreased in a short period by using the second substrate potential supplier 45.

Figure 11:
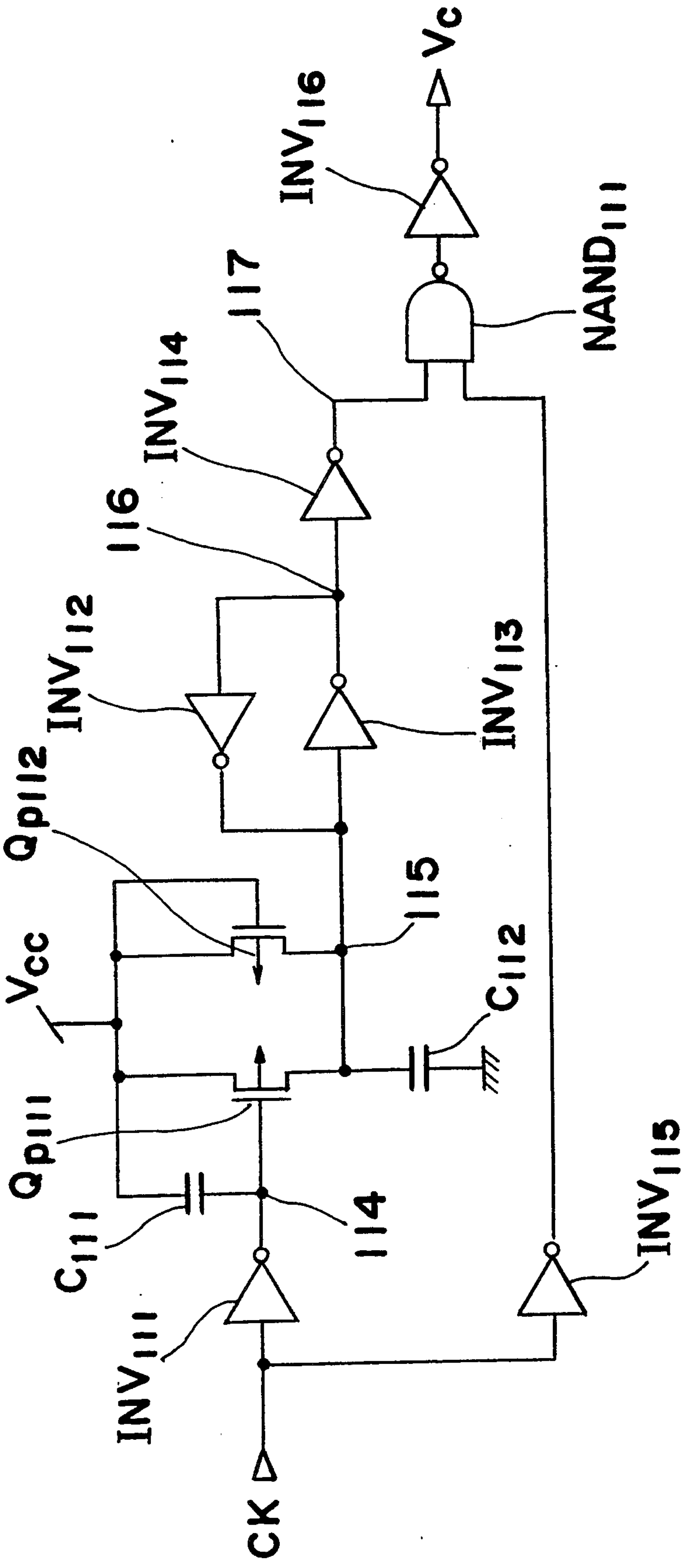
FIG. 11 is a circuit diagram of a control signal generator.

Next, the control signal generator 46 for generating the control signal for the second substrate potential detector 44 will be explained below. FIG. 11 shows a circuit diagram of the control signal generator 46 which includes P-type MOS transistors $Q_{p111}$ and $Q_{p112}$, capacitors $C_{111}$ and $C_{112}$, inverters $INV_{111}$–$INV_{116}$ and a NAND gate $NAND_{111}$. A signal CK having an inverted phase relative to an $\overline{RAS}$ signal is inputted to the inverters $INV_{111}$ and $INV_{115}$. The transistors $Q_{p111}$ and $Q_{p112}$ connected in parallel are connected between the external power supply potential $V_{CC}$ and a connection point 115, while a capacitor $C_{112}$ is connected between the connection point 115 and the ground potential $V_{SS}$. The output of the inverter $INV_{111}$ is connected through a connection point 114 to the gate of the transistor $Q_{p111}$, while the other capacitor $C_{111}$ is connected between the connection point 114 and the external power supply potential $V_{CC}$. The drains of the transistors $Q_{p111}$ and $Q_{p112}$ and the output of the inverter $INV_{112}$ are connected to the input of the inverter $INV_{113}$, and the output of the inverter $INV_{113}$ is connected to the inputs of the inverters $INV_{112}$ and $INV_{114}$. A latch is composed by both inverters $INV_{112}$ and $INV_{113}$ being shorted between the input and the output of each other. The outputs of the $INV_{114}$ and $INV_{115}$ are inputted to the NAND gate $NAND_{111}$ whose output is connected to the input of the inverter $INV_{116}$. The inverter $INV_{116}$ outputs a control signal.

The control signal generator 46 operates as will be explained below when the power source is turned on. The signal CK having the inverted phase of the $\overline{RAS}$ signal is a low-level when the power source is turned on, so that the inverter $INV_{111}$ tends to send a high-level signal. On the other hand, the potential at the connection point 114 rises due to the coupling with $C_{111}$ because the external power supply potential $V_{CC}$ rises when the power source is turned on. Then, the potential at the connection point 114 becomes a high-level when the power source is turned on. Because the gate of the transistor $Q_{p111}$ is connected to the connection point 114, the transistor $Q_{111}$ is turned off. Further, the gate potential and the source potential of the transistor $Q_{112}$ are equal to the external power supply potential $V_{CC}$ so that the transistor $Q_{p112}$ is also turned off. Then, the drain potentials of the transistors $Q_{p111}$ and $Q_{p112}$ or the potential at the connection point 115 does not rise. Furthermore, because the connection point 115 is connected through the capacitor $C_{112}$ to the ground potential $V_{SS}$, the potential at the connection point 115 does not increase in response to the rise of the external power source potential $V_{CC}$ when the power source is turned on. Then, the potential at the connection point 115 becomes low-level when the power source is turned on. Because the potential at the connection point 115 or the input of a latch composed of inverters $INV_{112}$ and $INV_{113}$ is a low-level, the potential at the connection point 116 or the output of the latch latches a high-level signal. Then, because the potential at the connection point 116 or the input of the inverter 114 is a high-level, the potential at the connection point 117 or the output of the inverter $INV_{114}$ becomes a low-level. Therefore, the NAND gate $NAND_{111}$ sends a high-level signal irrespectively of the other input of the NAND gate $NAND_{111}$ or the output of the inverter $INV_{115}$ for inverting the signal CK having the inverted phase of the $\overline{RAS}$ signal. Then, because the input of the inverter $INV_{116}$ is a high-level, the substrate potential detection signal $V_C$ or the output of the inverter $INV_{116}$ becomes a low-level.

On the other hand, the control signal generator operates as will be explained below after the power source is turned on. When the $\overline{RAS}$ signal first becomes low after the power source is turned on, the signal CK having the inverted phase of $\overline{RAS}$ becomes a high-level. Then, the output of the inverter $INV_{115}$ becomes a low-level and the output of the NAND gate $NAND_{111}$ becomes a high-level. Therefore, the control signal $V_C$ becomes a low-level. At the same time, because the signal CK becomes a low-level, the inverter $INV_{111}$ extracts the charges stored in the capacitor $C_{111}$ to make the potential at the connection point 114 a low-level. Then, because the gate potential of the transistor $Q_{111}$ is the potential at the connection point 114, the transistor $Q_{111}$ is turned on. Then, by supplying positive charges by the transistor $Q_{p111}$ to the capacitor $C_{112}$ being connected to the common drain potentials of the transistors $Q_{p111}$ and $Q_{p112}$, the potential at the connection point 115 becomes a high-level. Because the potential at the connection point 115 or at the input of the latch composed of the inverters $INV_{112}$ and $INV_{113}$ is a high-level, the potential at the connection point 116 or the output of the latch latches a low-level signal, and then the potential at the connection point 117 or the output of the inverter $INV_{114}$ or an input of the NAND gate $NAND_{111}$ becomes a high-level. Then, as long as the power supply supplies electric power, the input of the NAND gate $NAND_{111}$ is kept at a high-level. Because the NAND gate $NAND_{111}$ has another input to receive the output of the inverter $INV_{115}$ having the input of the signal CK having the inverted phase of $\overline{RAS}$, the output of the NAND gate $NAND_{111}$ or the input of the inverter $INV_{116}$ is equal to the signal CK, and the control signal $V_C$ or the output of the inverter $INV_{116}$ is equal to the signal having the same phase of $\overline{RAS}$.

As explained above, when the power source is turned on and when the $\overline{RAS}$ level is a high-level, the control signal $V_C$ for the second substrate potential detector 44 is a low-level in order to operate the second substrate potential detector 44. Otherwise or in case of standby, the control signal $V_C$ is a high-level in order to stop the operation of the second substrate potential detector 44.

Figure 12:
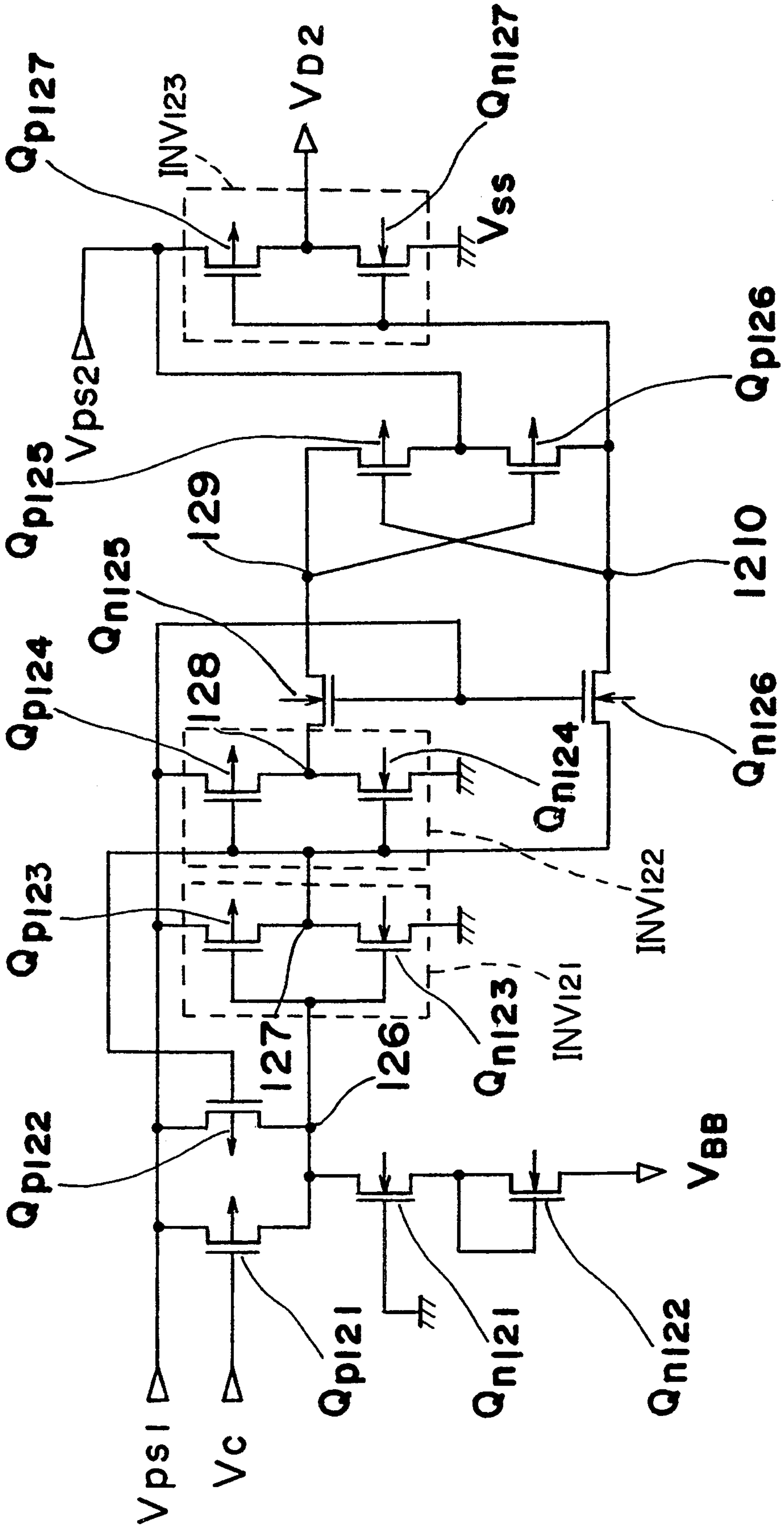
FIG. 12 is a circuit diagram of a second substrate potential detector.

Next, the second substrate potential detector 44 will be explained below. FIG. 12 shows the circuit diagram of the second substrate potential detector 44 composed of P-type MOS transistors $Q_{p121}$–$Q_{p126}$ and N-type MOS transistors $Q_{n121}$–$Q_{n124}$. The only differences between the second substrate potential detector 44 and the first one 42 are that the supply current and response time of the transistors are enhanced and that the gate of the transistor $Q_{p121}$ is connected not to the ground potential $V_{SS}$, but to the control signal $V_C$ generated by the substrate potential detector 46.

In the second substrate potential detector 44, two P-type MOS transistors $Q_{p121}$ and $Q_{p122}$ are connected in parallel between the first power supply potential and a connection point 126 while an N-type transistor $Q_{n121}$ and an N-type transistor $Q_{n122}$ are connected in series between the connection point 126 and the substrate potential $V_{BB}$. The gate of the transistor $Q_{p121}$ receives the control signal $V_C$ from the control signal generator 46. The gate of the transistor $Q_{n121}$ is connected to the ground potential $V_{SS}$, while the gate and the source of the transistor $Q_{n122}$ are connected to each other. A P-type transistors $Q_{p123}$ and an N-type MOS transistor $Q_{n123}$ are connected in series between the first power supply potential $V_{pS1}$ and the ground potential $V_{SS}$ and the gates of the two transistors $Q_{p123}$ and $Q_{n123}$ are connected to the connection point 126. A connection point 127 of the two transistors $Q_{p123}$ and $Q_{n123}$ composing an inverter $INV_{121}$ is connected for feedback to the gate of the transistor $Q_{p123}$. Another inverter $INV_{122}$ made of a P-type MOS transistor $Q_{p124}$ and an N-type MOS transistor $Q_{n124}$ connected in series via a connection point 128 is connected between the first power supply potential $V_{pS1}$ and the ground potential $V_{SS}$, and the gates of the two transistors $Q_{p124}$ and $Q_{n124}$ are also connected to the connection point 127. The gates of N-type transistors $Q_{n125}$ and $Q_{n126}$ are connected to each other and also to the first power supply potential $V_{pS1}$. The sources of two P-type MOS transistors $Q_{p125}$ and $Q_{p126}$ are connected to a second power supply potential $V_{pS2}$, while their gates are connected to the drain of the other transistor of the two. The transistors $Q_{n125}$, $Q_{p125}$, $Q_{p126}$ and $Q_{n126}$ are connected in series between the connection points 128 and 127. Then, a third inverter $INV_{123}$ made of a P-type MOS transistor $Q_{p127}$ and an N-type transistor $Q_{n127}$ connected in series is connected between the second power supply potential $V_{pS2}$ and the ground potential $V_{SS}$. The gates of the two transistors $Q_{p127}$ and $Q_{n127}$ are connected to a connection point 1210 or the drain of the transistor $Q_{p126}$. The potential at a connection point 1211 of the two transistors $Q_{p127}$ and $Q_{n127}$ or the output of the inverter $INV_{123}$ is sent as the substrate potential detection signal $V_{D1}$ to the second substrate potential supplies 45. In this embodiment, the internal drop potential $V_{IPD}$ is supplied for the first power supply potential $V_{pS1}$.

The second substrate potential detector 44 explained above acts similarly to the first one 42 when the control signal $V_C$ received from the control signal generator 46 is equal to the ground potential $V_{SS}$, that is, when the power source is turned on and when the second substrate potential detector 44 is activated. However, because the performance of the transistors on the supply current and the response time adopted in the second substrate potential detector 42 are more enhanced than the counterparts of the first substrate potential detector 42, the response to the substrate potential $V_{BB}$ is faster in the second substrate potential detector 44 than in the first one 42.

Further, when the control signal $V_C$ is made high-level in order to stop the operation of the second substrate potential detector 44, or in cases of standby, the transistor $Q_{p121}$ is turned off. The performance of the transistor $Q_{p122}$ on supply current and response current is much smaller than that of the transistor $Q_{p121}$ because the transistor $Q_{p122}$ is used to determine the width between the upper set potential $V_B$ and the lower one $V_A$. Therefore, even when the substrate potential $V_{BB}$ floats up considerably and the transistor $Q_{p122}$ is turned on, a following subsequent rather small current flows between the first power supply potential $V_{pS1}$ and the ground potential $V_{BB}$:

$$I_{124\text{-}126(b\text{-}c)} = I_{dp121}.$$

And, the potential at the connection point 126 is equal to the potential realized when the drain currents $I_{dn121}$, $I_{dn122}$ and $I_{124\text{-}126(b\text{-}c)}$ are equal to each other. When the substrate potential $V_{BB}$ becomes low and the potential at the connection point 126 or the input potential of the inverter $INV_{121}$ composed of the transistors $Q_{p123}$ and $Q_{n123}$ attains the so-called threshold voltage of the inverter $INV_{121}$, the drain currents $I_{dn121}$ and $I_{dn122}$ of the transistors $Q_{n121}$ and $Q_{n122}$ can be expressed as follows:

$$I_{dn121} = \beta(-V_{128} - V_{tn121})^2$$

and $$I_{dn122} = \beta((V_{128} - V_{BB}) - V_{tn122})^2,$$

wherein $V_{tn121}$ and $V_{tn122}$ designate the threshold voltages of the transistors $Q_{n121}$ and $Q_{n122}$, respectively. Therefore, the potential at the connection point 126 or the drain potentials of the three transistors $Q_{p121}$, $Q_{p122}$ and $Q_{n121}$ attains a potential to invert the output of the inverter $INV_{121}$ or to the so-called threshold voltage of the inverter $INV_{121}$, the substrate potential $V_{BB}$ decreases until the drain current $I_{dp121}$ of the transistor $Q_{p121}$ being almost independent of the external power supply potential $V_{CC}$ becomes equal to the drain currents $I_{dn121}$ and $I_{dn122}$ of the transistors $Q_{n121}$ and $Q_{n122}$:

$$I_{dp121} = I_{dn121} = I_{dn122}.$$

Therefore, the potential at the connection point 126 becomes almost low level according to the substrate potential $V_{BB}$ under operation. Then, the potential at the connection point 127 becomes high-level, the substrate potential detection signal $V_{D2}$ becomes low-level, and the transistor $Q_{p122}$ is turned off. Thus, this state is kept until the control signal $V_C$ becomes low-level. Then, when the control signal $V_C$ is high-level, the dissipation current of the second substrate potential detector 44 vanishes, and the substrate potential supplier 45 is not activated also. Therefore, the dissipation current can be decreased.

It is understood that various other modifications will be apparent to and can be readily made by those skilled in the art without departing from the scope and spirit of the present invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which the present invention pertains.

What is claimed is:

1. A substrate potential generator, comprising:

a substrate potential detector for generating a substrate potential detection signal having alternating first and second states according to a reference potential and a received substrate potential of a substrate, the substrate potential detection signal becoming the second state each time the substrate potential decreases to a prescribed lower setting potential, and the substrate potential detection signal becoming the first state each time the substrate potential increases to a prescribed upper setting potential which is higher than the prescribed lower setting potential; and a substrate potential supplier which when activated supplies charges to the substrate and which operates according to the substrate potential detection signal received from the substrate potential detector, said substrate potential supplier deactivating to increase the substrate potential when the substrate potential detection signal is at the second state, and activating to decrease the substrate potential when the substrate potential detection signal is at the first state.

2. A substrate potential generator according to claim 1, said substrate potential detector comprising parallel connected first and second MOS transistors and series connected third and fourth MOS transistors, said first through fourth MOS transistors connected between a reference potential and a substrate potential, wherein said third and fourth MOS transistors are for detecting the substrate potential, and wherein said second MOS transistor is turned on to supply the lower setting potential when said substrate potential supplier is activated while said second MOS transistor is turned off to supply the upper setting potential when said substrate potential supplier is not activated.

3. A substrate potential generator according to claim 1, further comprising an internal potential generator which generates said reference potential.

4. A substrate potential generator according to claim 3, said substrate potential detector comprising a detector for detecting a potential between the reference potential and the substrate potential, a first amplifier for amplifying the potential between said reference potential and a ground potential, a second amplifier for amplifying the potential between a power supply potential and a ground potential, said reference potential being different from the power supply potential, said substrate potential detector further comprising a first N-type MOS transistor having a gate connected to said reference potential, a second and a third P-type MOS transistor and a fourth N-type MOS transistor connected in series between an output of the first amplifier and an inverted output of the first amplifier, the fourth N-type MOS transistor having a gate connected to said reference potential, a connection point of the second and the third transistors is connected to the power supply potential, gates of the second and the third transistors are respectively connected to drains of the third and the second transistors, the second amplifier receiving as an input the drain potential of the second transistor and outputting the substrate potential detection signal.

5. A substrate potential generator, comprising:

a first substrate potential detector for generating a first substrate potential detection signal having alternating first and second states according to a reference potential and a received substrate potential of a substrate, the first substrate potential detection signal becoming the second state each time the substrate potential decreases to a first prescribed lower setting potential, and the substrate potential detection signal becoming the first state each time the substrate potential increases to a first prescribed upper setting potential which is higher than the first prescribed lower setting potential;

a first substrate potential supplier which when activated supplies charges to the substrate and which operates according to the first substrate potential detection signal received from the first substrate potential detector, said substrate potential supplier deactivating to increase the substrate potential when the first substrate potential detection signal is at the second state, and activating to decrease the substrate potential when the first substrate potential detection signal is at the first state;

a control signal generator for supplying a control signal when the substrate potential has to be increased quickly;

a second substrate potential detector, which is activated by the control signal received from the control signal generator and which has a faster response than the first substrate potential detector, for generating a second substrate potential detection signal having alternating third and fourth states according to a reference potential and a received substrate potential of the substrate, the second substrate potential detection signal becoming the fourth state each time the substrate potential decreases to a second prescribed lower setting potential, and becoming the third state each time the substrate potential increases to a second prescribed upper setting potential which is higher than the second prescribed lower setting potential; and a second substrate potential supplier which when activated supplies charges to the substrate and which operates according to the second substrate potential detection signal received from the second substrate potential detector, said substrate potential supplier deactivating to increase the substrate potential when the second substrate potential detection signal is at the fourth state, and activating to decrease the substrate potential when the second substrate potential detection signal is at the third state.

6. A substrate potential generator according to claim 5, said control signal generator comprising a parallel connection of first and second MOS transistors, the first MOS transistor having a gate connected to a power supply potential generated by a power supply and the second MOS transistor having a gate receiving the control signal, the first and second MOS transistors connected in series to a capacitor between a power supply potential and a ground potential, wherein a potential of a connection point of the first and second MOS transistors and the capacitor becomes a low-level when the power supply is turned on so as to detect the turn on of the power supply.

7. A substrate potential generator according to claim 5, at least one of said first and second substrate potential detectors comprising a detector for detecting a potential between the reference potential and the substrate potential, a first amplifier for amplifying the potential between said reference potential and a ground potential, a second amplifier for amplifying between a power supply potential and a ground potential, said reference potential being different from the power supply potential, said substrate potential detector further comprising a first N-type MOS transistor having a gate connected to said reference potential, a second and a third P-type MOS transistor and a fourth N-type MOS transistor connected in series between the output of the first amplifier and an inverted output of the first amplifier, the fourth N-type MOS transistor having a gate connected to said reference potential, a connection point of the second and the third transistors is connected to the power supply potential, gates of the second and the third transistors are respectively connected to drains of the third and the second transistors, the second amplifier receiving as the input the drain potential of either of the second and third transistors and outputting the substrate potential detection signal.

8. A substrate potential generator according to claim 5, further comprising an internal potential generator which generates said reference potential.

9. A substrate potential generator according to claim 5, wherein said control signal is generated when a power source is turned on and when negative charges are supplied.

* * * * *